United States Patent
Osame et al.

(10) Patent No.: US 7,460,095 B2
(45) Date of Patent: Dec. 2, 2008

(54) DISPLAY DEVICE AND MANUFACTURING METHOD THEREOF

(75) Inventors: Mitsuaki Osame, Kanagawa (JP); Yu Yamazaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 600 days.

(21) Appl. No.: 11/011,881

(22) Filed: Dec. 14, 2004

(65) Prior Publication Data

US 2005/0134189 A1 Jun. 23, 2005

(30) Foreign Application Priority Data

Dec. 18, 2003 (JP) ............... 2003-421599

(51) Int. Cl.
*G09G 3/32* (2006.01)

(52) U.S. Cl. .......................... 345/82; 345/83

(58) Field of Classification Search ........... 345/102, 345/44, 30, 204, 209, 214, 207, 76, 82–84, 345/55, 92, 39, 78; 315/169.1–169.3, 241, 315/291–294, 149, 185 S, 312–317; 324/510; 257/59, 72, 83, 79; 438/282, 4, 22; 327/524; 359/630; 349/139; 250/370.9, 370.14
See application file for complete search history.

(56) References Cited

U.S. PATENT DOCUMENTS

| | | | | |
|---|---|---|---|---|
| 5,027,040 A * | 6/1991 | Ikeda et al. | ............. | 315/241 R |
| 5,446,445 A * | 8/1995 | Bloomfield et al. | ......... | 340/521 |
| 5,477,858 A * | 12/1995 | Norris et al. | ............ | 600/441 |
| 6,600,160 B2 * | 7/2003 | Kobayashi et al. | ..... | 250/370.14 |
| 6,870,192 B2 * | 3/2005 | Yamazaki et al. | ............ | 257/79 |
| 6,900,785 B2 * | 5/2005 | Kimura | .................... | 345/76 |
| 6,975,298 B2 * | 12/2005 | Koyama et al. | ............ | 345/98 |
| 6,975,311 B2 * | 12/2005 | Ide et al. | ................. | 345/209 |
| 7,005,647 B2 * | 2/2006 | Kobayashi et al. | ..... | 250/370.09 |

(Continued)

FOREIGN PATENT DOCUMENTS

JP 2002-169509 * 6/2002

(Continued)

OTHER PUBLICATIONS

Zou, D. et al, "Improvement of Current-Voltage Characteristics in Organic Light Emitting Diodes by Application of Reversed-Bias Voltage," Japanese Journal of Applied Physics, vol. 37, part 2, No. 11B, pp. L1406-L1408, Nov. 15, (1998).

(Continued)

*Primary Examiner*—Prabodh Dharia
(74) *Attorney, Agent, or Firm*—Cook Alex Ltd.

(57) ABSTRACT

A display device capable of applying reverse driving voltage for a light emitting element to a light emitting element every certain period for prolonging light emitting element's life and burning out a shorted portion. Besides a path for supplying forward current to the light emitting element, a path for supplying reverse current is provided. A driving transistor is provided in the former path while a transistor (AC transistor) is provided in the latter path, thereby a switching between the two paths is controlled. The AC transistor has a rate L/W of a channel length L to a channel width W smaller than that of the driving transistor. Accordingly, current flowing into the light emitting element can flow into the AC transistor in the case of reverse driving voltage being applied to the light emitting element.

24 Claims, 17 Drawing Sheets

U.S. PATENT DOCUMENTS

| | | | |
|---|---|---|---|
| 7,045,369 B2* | 5/2006 | Yamazaki et al. | 438/4 |
| 7,084,847 B2* | 8/2006 | Kageyama et al. | 345/92 |
| 7,170,094 B2* | 1/2007 | Yamazaki et al. | 345/102 |
| 7,176,857 B2* | 2/2007 | Osame et al. | 345/76 |
| 7,202,842 B2* | 4/2007 | Kasai et al. | 345/78 |
| 7,245,297 B2* | 7/2007 | Kimura et al. | 345/214 |
| 7,256,758 B2* | 8/2007 | Hu et al. | 345/82 |
| 7,385,573 B2* | 6/2008 | Osame et al. | 345/76 |
| 2002/0042152 A1* | 4/2002 | Yamazaki et al. | 438/4 |
| 2003/0001870 A1* | 1/2003 | Kageyama et al. | 345/690 |
| 2003/0058543 A1* | 3/2003 | Sheedy et al. | 359/630 |
| 2003/0076281 A1* | 4/2003 | Morgan et al. | 345/44 |
| 2003/0160745 A1 | 8/2003 | Osame et al. | |
| 2003/0203523 A1* | 10/2003 | Yamazaki et al. | 438/22 |
| 2005/0063194 A1* | 3/2005 | Lys et al. | 362/545 |
| 2005/0151489 A1* | 7/2005 | Lys et al. | 315/308 |
| 2005/0168491 A1* | 8/2005 | Takahara et al. | 345/690 |
| 2005/0264472 A1* | 12/2005 | Rast | 345/30 |
| 2006/0050032 A1* | 3/2006 | Gunner et al. | 345/82 |
| 2006/0054893 A1* | 3/2006 | Nathan et al. | 257/72 |
| 2007/0035340 A1* | 2/2007 | Kimura | 327/524 |
| 2007/0063935 A1* | 3/2007 | Yoshida | 345/76 |

OTHER PUBLICATIONS

Office Action re Chinese application No. CN 200410082150.8, dated Apr. 18, 2008 (with English translation).

* cited by examiner

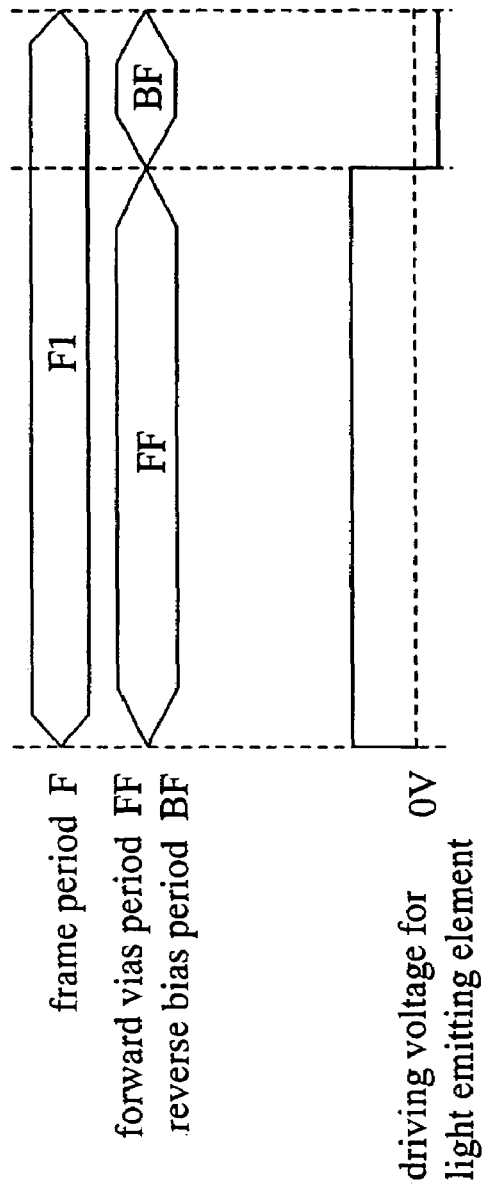
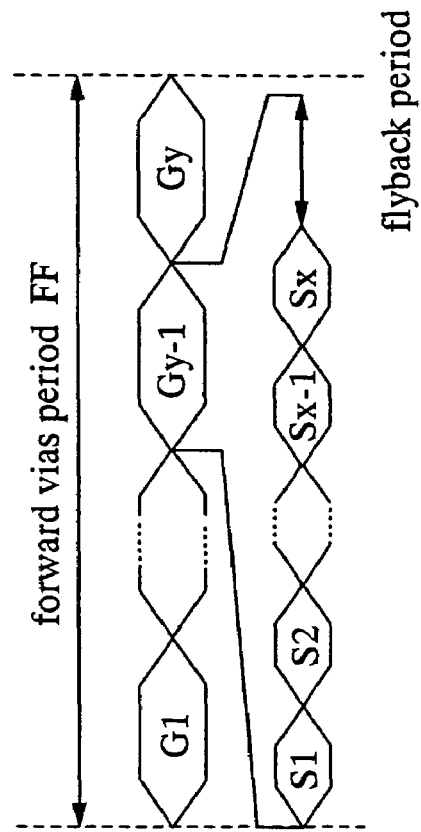
FIG. 4A
FIG. 4B

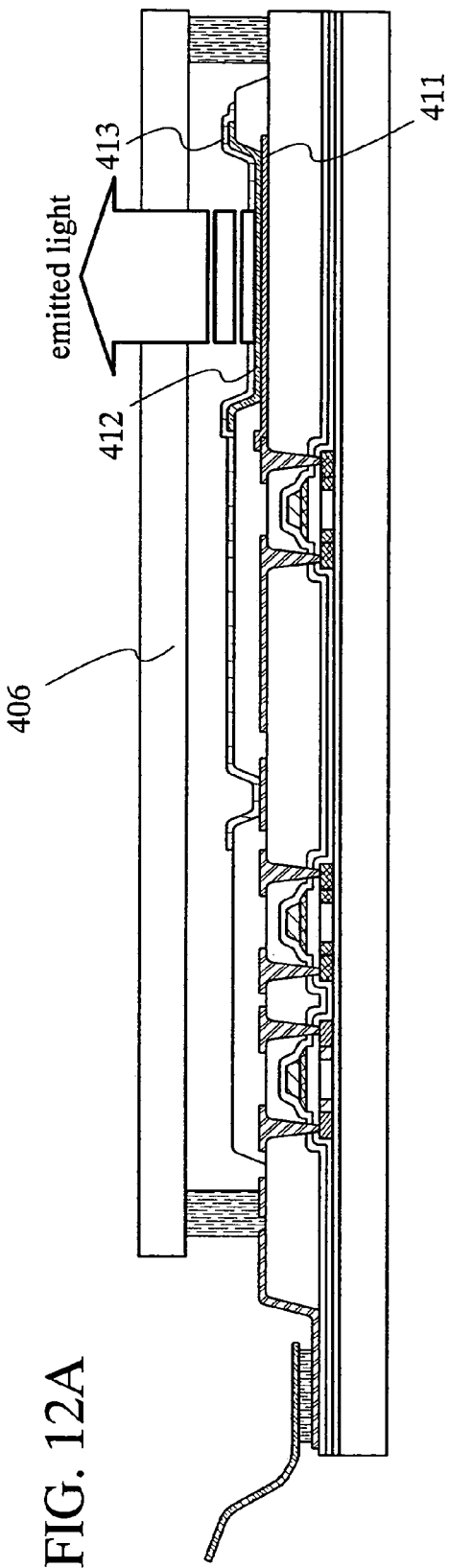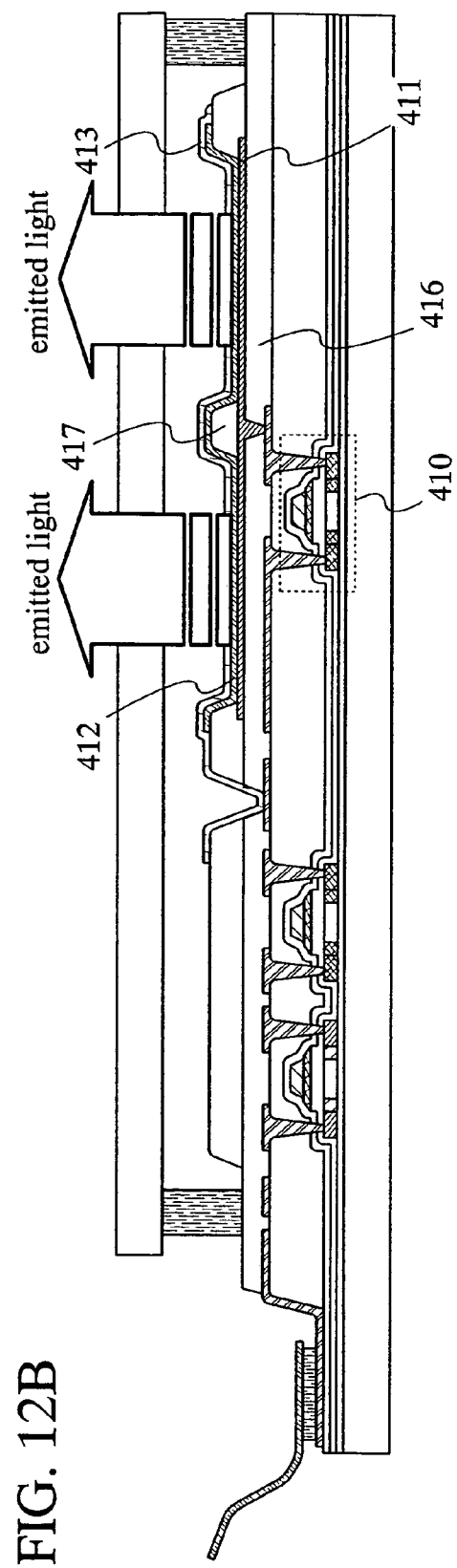

DISPLAY DEVICE AND MANUFACTURING METHOD THEREOF

BACKGROUND OF THE INVENTION

1. Field of the Invention

The present invention relates to a display device inputted with video signals to display images, and particularly to a display device having a light emitting element. In addition, the invention relates to an electronic apparatus employing the display device.

2. Description of the Related Art

Described hereinafter is a display device in which a light emitting element is provided in each pixel and light emission of the light emitting element is controlled to display an image. The display device is constituted by a display and a peripheral circuitry for inputting signals to the display. FIG. 16 shows a configuration of a pixel portion of the display.

Source signal lines S1 to Sx, gate signal lines G1 to Gy, and power source lines V1 to Vx are arranged in a pixel portion 1603, and x columns and y rows (x and y are positive integers) of pixels are arranged therein. Each pixel 1700 includes a switching transistor 1701, a driving transistor 1702, a storage capacitor 1703, and a light emitting element 1704.

FIG. 17 shows an enlarged pixel of the pixel portion 1603 shown in FIG. 16.

A pixel is constituted by one source signal line S among the source signal lines S1 to Sx, one gate signal line G among the gate signal lines G1 to Gy, one power source line V among the power source lines V1 to Vx, the switching transistor 1701, the driving transistor 1702, the storage capacitor 1703, and the light emitting element 1704.

As for the switching transistor 1701, a gate electrode is connected to the gate signal line G, and one of a source electrode and a drain electrode is connected to the source signal line S while the other is connected to a gate electrode of the driving transistor 1702 and one electrode of the storage capacitor 1703. As for the driving transistor 1702, one of a source electrode and a drain electrode is connected to the power source line V while the other is connected to an anode or a cathode of the light emitting element 1704. As for the storage capacitor 1703, one of two electrodes is connected to the driving transistor 1702 and the switching transistor 1701 as described above while the other is connected to the power source line V.

An operation for light emission of the light emitting element 1704 in the above-described pixel is described below.

The gate signal line G is inputted with a signal and the switching transistor 1701 is turned ON. Then, through the source and drain electrodes of the switching transistor 1701, a signal from the source signal line S is inputted to the gate electrode of the driving transistor 1702. In addition, potential of the source signal line S is stored in the storage capacitor 1703. The signal inputted to the gate electrode of the driving transistor 1702 turns the driving transistor 1702 ON. The amount of current to be flown between the source and drain electrodes of the driving transistor 1702 depends on a potential difference between the gate electrode of the driving transistor 1702 and the power source line V. The current flowing between the source and drain electrodes of the driving transistor 1702 flows into the light emitting element 1704 through a pixel electrode thereof, resulting in light emission of the light emitting element 1704.

It is necessary to always flow a constant amount of current into the light emitting element 1704 during light emission, regardless of the deterioration of the light emitting element 1704. To flow a constant amount of current into the light emitting element 1704 regardless of a potential difference between the source and drain electrodes of the driving transistor 1702, it is preferable to design so that the driving transistor 1702 operates in the saturation region.

As described above, forward driving voltage for a light emitting element is always applied to a light emitting element of a conventional display.

However, it has been found that the deterioration of an I-V characteristic of a light emitting element can be suppressed by applying reverse driving voltage for a light emitting element to the light emitting element every certain period (see Non-Patent Document 1).

[Non-Patent Document 1]

D. Zou et al., "Improvement of Current-Voltage Characteristics in Organic Light Emitting Diodes by Application of Reversed-Bias Voltage", Jpn. J. Appl. Phys. Vol. 37 (1998), pp. L1406-L1408, Part 2, No. 11B, 15 Nov. 1998

SUMMARY OF THE INVENTION

In addition, a pixel electrode and a counter electrode may be short-circuited, causing an initial defect of generating a non-emission region in a pixel. The short circuit occurs in the following cases: the case where a foreign material (dust) adheres prior to formation of a light emitting element; the case where a pin hole occurs in an electroluminescent layer due to a fine jut of an anode occurred when the anode is formed; and the case where a pin hole occurs in an electroluminescent layer due to unflatness of the electroluminescent layer because of a thin thickness of the electroluminescent layer; and the like. In a pixel having such initial defect, a light emission/non-light emission in accordance with signals cannot be performed and almost all current flows to the shorted portion, which may cause such phenomena that all light emitting elements stop emitting light and that a certain pixel emits light or stops emitting light. Accordingly, image display cannot be carried out satisfactorily.

In addition to the aforementioned initial defect, a progressive defect due to a new short circuit between an anode and a cathode may occur as time passes. The short circuit between the anode and the cathode occurs as time passes due to a fine jut occurred when the anode is formed. That is, in a lamination in which an electroluminescent layer is interposed between a pair of electrodes, a potential short circuit portion exists and as time passes, the short circuit portion comes out. The progressive defect is also said to be occurred due to a loose connection between an electroluminescent layer and a cathode caused by a fine void between the electroluminescent layer and the cathode expanding as time passes.

The initial defect can be suppressed from further progressing by applying reverse driving voltage for a light emitting element to the light emitting element to insulate the short circuit portion by carbonization or oxidization. The progressive defect can be suppressed from occurring and progressing by applying reverse driving voltage for a light emitting element to the light emitting element to insulate the short circuit portion by carbonization or oxidization, by suppressing expansion of the fine void between the electroluminescent layer and the cathode, or the like.

However, to insulate a short circuit portion, a large amount of current enough to insulate the short circuit portion is required to flow. The amount of current enough to insulate the short circuit portion is generally much larger than the amount of forward current for light emission of the light emitting element. In a pixel configuration shown in FIGS. 16 and 17, the amount of current flowing to the light emitting element 1704 is controlled by the driving transistor 1702 both in the forward direction and in the reverse direction. In the case of the amount of current flowing between a source electrode and a drain electrode during operation of the driving transistor 1702 in the saturation region being set as the amount of forward current flowing into the light emitting element 1704, when reverse driving voltage for a light emitting element is applied to the light emitting element 1704, the driving transistor 1702 cannot supply enough current for insulating the short circuit portion.

In view of the aforementioned problems, the invention provides a display device in which reverse driving voltage for a light emitting element can be applied to the light emitting element every certain period to prolong a light emitting element's life and insulate a short circuit portion.

According to a display device of the invention, in addition to a path for supplying forward current to a light emitting element, a path for supplying reverse current to the light emitting element is provided. A driving transistor is provided in the former path whereas a transistor (an AC transistor) is provided in the latter path, thereby switching between the two paths is controlled. In addition, as the AC transistor, a transistor having a rate L/W of a channel length L to a channel width W smaller than that of the driving transistor is employed. According to this configuration, when reverse driving voltage for a light emitting element is applied to the light emitting element, current flowing through the light emitting element can be supplied to the AC transistor.

Specifically, according to the invention, the IIW of the driving transistor is set larger than that of the AC transistor to operate the driving transistor in the saturation region and the AC transistor in the linear region. More specifically, the driving transistor is formed such that L is larger than W and L/W thereof is preferably 5/1 or more. The AC transistor is formed such that L is equal to or less than W. Accordingly, the amount of reverse current flowing to the light emitting element when reverse driving voltage for a light emitting element being applied to the light emitting element in the pixel can be larger than the amount of current flowing to the light emitting element when forward driving voltage for a light emitting element being applied to the light emitting element.

A display device according to the invention comprises a light emitting element, a first path for supplying forward current to the light emitting element, and a second path for supplying reverse current to the light emitting element, wherein the first path includes a driving transistor, the second path includes an AC transistor, and switching between the first path and the second path is controlled by the driving transistor and the AC transistor.

A display device according to the invention comprises a pixel including a light emitting element, a driving transistor for controlling the amount of forward current flowing into the light emitting element, a switching transistor for controlling input of a video signal, and an AC transistor for controlling reverse current flowing into the light emitting element.

A display device according to the invention comprises a pixel including a light emitting element, a driving transistor for controlling the amount of forward current flowing into the light emitting element, a switching transistor for controlling input of a video signal, and an AC transistor for controlling reverse current flowing into the light emitting element, wherein the light emitting element has a pixel electrode and an opposing electrode, a gate electrode of the switching transistor is connected to a gate signal line, one of source and drain electrodes of the switching transistor is connected to a source signal line flowing video signals while the other is connected to a gate electrode of the driving transistor, one of source and drain electrodes of the driving transistor is connected to a power source line while the other is connected to the pixel electrode of the light emitting element, a gate electrode of the AC transistor is connected to the power source line, one of source and drain electrodes of the AC transistor is connected to the pixel electrode while the other is connected to a current lead-in line, the polarity of the driving transistor and the AC transistor are identical to each other, and the driving transistor and the AC transistor operate in the saturation region and the linear region respectively.

A display device according to the invention comprises a pixel including a light emitting element, a driving transistor for controlling the amount of forward current flowing into the light emitting element, a switching transistor for controlling input of a video signal, and an AC transistor for controlling reverse current flowing into the light emitting element, wherein the light emitting element has a pixel electrode and an opposing electrode, a gate electrode of the switching transistor is connected to a gate signal line, one of source and drain electrodes of the switching transistor is connected to a source signal line flowing video signals while the other is connected to a gate electrode of the driving transistor, one of source and drain electrodes of the driving transistor is connected to a power source line while the other is connected to the pixel electrode of the light emitting element, a gate electrode of the AC transistor is connected to the power source line, one of source and drain electrodes of the AC transistor is connected to the pixel electrode while the other is connected to the power source line, the polarity of the driving transistor and the AC transistor are identical to each other, and the driving transistor and the AC transistor operate in the saturation region and the linear region respectively.

A driving method of a display device according to the invention comprises the steps of: dividing one frame period into a plurality of subframe periods, providing a write period and a display period in each subframe period, setting whether a light emitting element emits light or not by a switching transistor and a driving transistor while flowing reverse current into the light emitting element in the write period, operating the light emitting element in the display period in accordance with the setting in the write period, and controlling the total period of light emission of the light emitting element to perform a gray scale display.

A driving method of a display device according to the invention comprises the steps of: dividing one frame period into a plurality of subframe periods and a plurality of reverse bias periods, providing a write period and a display period in each subframe period, setting whether a light emitting element emits light or not by a switching transistor and a driving transistor in the write period, operating the light emitting element in the display period in accordance with the setting in the write period, supplying reverse current to the light emitting element in the reverse bias periods, and controlling the total period of light emission of the light emitting element to perform a gray scale display.

A driving method of a display device according to the invention comprises the steps of: dividing one frame period into a plurality of subframe periods and one reverse bias period, providing a write period and a display period in each subframe period, setting whether a light emitting element emits light or not by a switching transistor and a driving transistor in the write period, operating the light emitting element in the display period in accordance with the setting in the write period, supplying reverse current to the light emitting element in the reverse bias period, and controlling the total period of light emission of the light emitting element to perform a gray scale display.

A driving method of a display device according to the invention comprises the steps of: dividing one frame period into a forward bias period and a reverse bias period, supplying forward current to a light emitting element by a switching transistor and a driving transistor while emitting the light emitting element at luminance in accordance with the amount of current flowing into the light emitting element in the forward bias period, and supplying reverse current to the light emitting element in the reverse bias period.

The above-described configuration enables to flow a constant amount of current into a light emitting element when forward driving voltage for a light emitting element is applied to the light emitting element while to flow the amount of current enough to insulate the short circuit portion into the short circuit portion when reverse driving voltage for a light emitting element is applied to the light emitting element, and enables to prolong a light emitting element's life.

BRIEF DESCRIPTION OF THE DRAWINGS

FIGS. 4A and 4B are timing charts in an analog gray scale method of the display device according to the invention.

FIGS. 12A and 12B are views showing cross sections of the display device according to the invention (Embodiment 4).

DETAILED DESCRIPTION OF THE INVENTION

Although the invention is fully described by way of Embodiment Modes and Embodiments with reference to the accompanying drawings, it is to be understood that various changes and modifications will be apparent to those skilled in the art. Therefore, unless such changes and modifications depart from the scope of the invention, they should be construed as being included therein.

EMBODIMENT MODE 1

Figure 1:
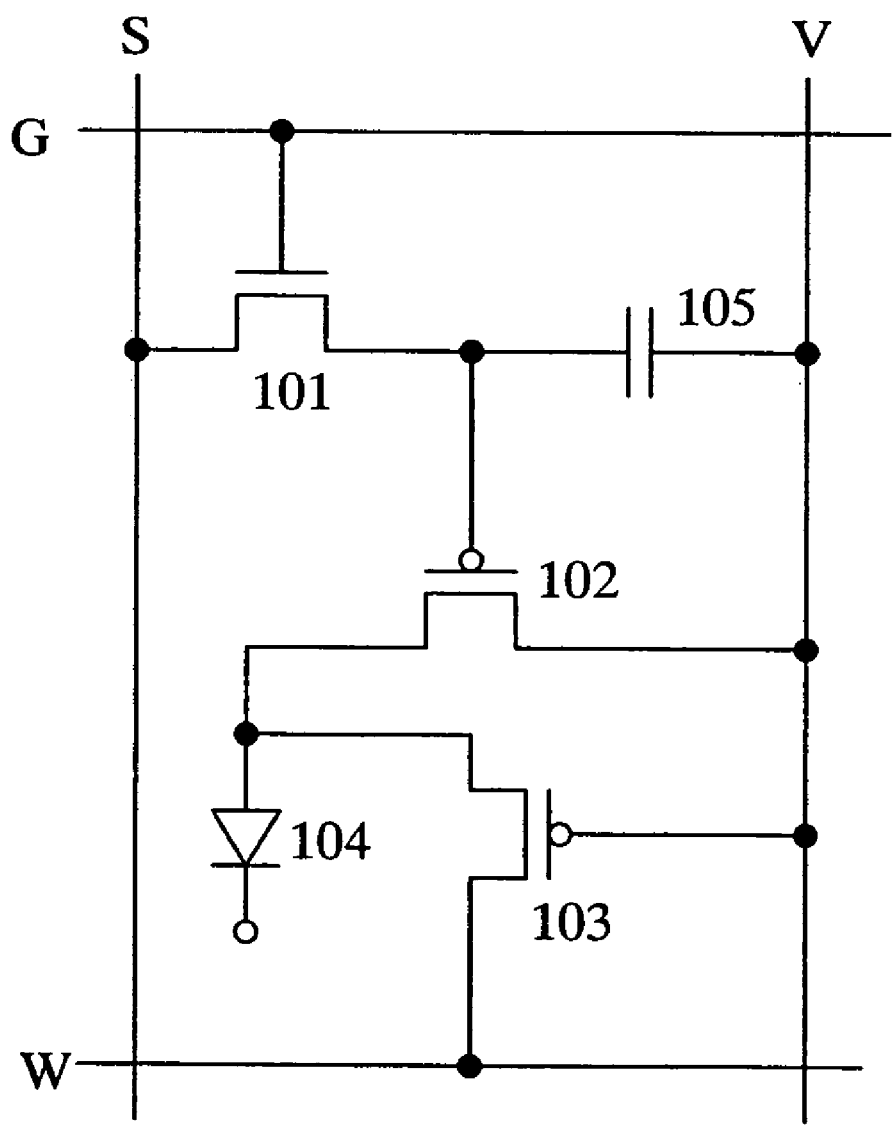
FIG. 1 is a circuit diagram of a pixel in the display device according to the invention.

One embodiment mode of the invention is shown in FIG. 1.

FIG. 1 shows one embodiment mode of a pixel in a light emitting device of the invention. The pixel shown in FIG. 1 includes a light emitting element 104, a transistor (a switching transistor) 101 serving as a switching element for controlling input of a video signal into the pixel, a driving transistor 102 for controlling the amount of current supplied to the light emitting element 104, and an AC transistor 103 for supplying current to be supplied to the light emitting element 104 when reverse driving voltage for a light emitting element being applied to the light emitting element 104. In addition, as is in this embodiment mode, a capacitor 105 for storing potential of a video signal may be provided in the pixel.

In this specification, a light emitting element means an element (OLED element) having a structure in which an electroluminescent layer that emits light as an electric field occurs is interposed between an anode and a cathode, however, the invention is not limited to this.

In addition, a light emitting element also means an element either that utilizes light emitted when transitting from singlet excitons to a base state (fluorescence) or that utilizes light emitted when transitting from triplet excitons to the base state (phosphorescence).

An electroluminescent layer includes a hole injection layer, a hole transporting layer, a light emitting layer, an electron transporting layer, an electron injection layer, and the like. A light emitting element is basically formed by laminating an anode, a light emitting layer, and a cathode in this order, however, a structure formed by laminating an anode, a hole injection layer, a light emitting layer, an electron injection layer, a cathode in this order, a structure formed by laminating an anode, a hole injection layer, a hole transporting layer, a light emitting layer, an electron transporting layer, an electron injection layer, and a cathode in this order, and the like may be adopted as well.

Note that the electroluminescent layer does not necessarily have a clearly separated laminate structure of the hole injection layer, the hole transporting layer, the light emitting layer, the electron transporting layer, and the electron injection layer and the like. That is, the electroluminescent layer may adopt a structure having a layer which is made of materials of the hole injection layer, the hole transporting layer, the light emitting layer, the electron transporting layer, and the electron injection layer and the like being mixed.

An inorganic substance may be mixed to the electroluminescent layer as well.

Any material such as a low molecular weight material, a high molecular weight material, or a medium molecular weight material can be employed for an electroluminescent layer of an OLED element.

In this specification, a medium molecular weight material does not have the subliming property, and the number of molecules thereof is 20 or less or a molecular chain length thereof is 10 μm or less.

The polarity of the driving transistor 102 and the AC transistor 103 are identical to each other.

A gate electrode of the switching transistor 101 is connected to a gate signal line G One of a source electrode and a drain electrode of the switching transistor 101 is connected to a source signal line S while the other is connected to a gate electrode of the driving transistor 102. The driving transistor 102 is connected to a power source line V and the light emitting element 104 so as to supply current from the power source line V to the light emitting element 104 as drain current of the driving transistor 102. In this embodiment mode, a gate electrode of the AC transistor 103 is connected to the power source line V, and one of a source electrode and a drain electrode thereof is connected to a current lead-in line W while the other is connected to a pixel electrode of the light emitting element 104.

In this specification, when the source or drain electrode of the driving transistor 102 is connected to an anode of the light emitting element 104, the anode is called a pixel electrode whereas a cathode thereof is called an opposing electrode. To the contrary, when the source or drain electrode of the driving transistor 102 is connected to a cathode of the light emitting element 104, the cathode is called a pixel electrode whereas an anode thereof is called an opposing electrode.

In FIG. 1, since an anode is connected to the driving transistor 102, the anode corresponds to a pixel electrode and a cathode corresponds to an opposing electrode.

Two electrodes of the capacitor 105 are connected to the power source line V and a gate electrode of the driving transistor 102 respectively. The capacitor 105 is provided for storing a potential difference between electrodes of the capacitor 105 during the switching transistor 101 is not selected (OFF). Note that although the capacitor 105 is provided in FIG. 1, the invention is not limited to this configuration and the capacitor 105 is not necessarily provided.

In FIG. 1, the driving transistor 102 and the AC transistor 103 are p-channel transistors and the drain electrode of the driving transistor 102 and the anode of the light emitting element 104 are connected to each other. Instead, when the driving transistor 102 and the AC transistor 103 are n-channel transistors, the source electrode of the driving transistor 102 and the cathode of the light emitting element 104 are connected to each other. In the latter case, the cathode of the light emitting element 104 corresponds to a pixel electrode and the anode corresponds to an opposing electrode.

In addition, in this embodiment mode, L/W of the driving transistor 102 is set larger than that of the AC transistor 103 to operate the driving transistor 102 in the saturation region and the AC transistor 103 in the linear region. Specifically, the driving transistor 102 is formed such that L is larger than W and L/W thereof is preferably 5/1 or more. The AC transistor 103 is formed such that L is equal to or less than W.

A driving method with a digital time gray scale method by employing the pixel shown in FIG. 1 is described below using timing charts in FIGS. 2A and 2B.

Figure 2A:
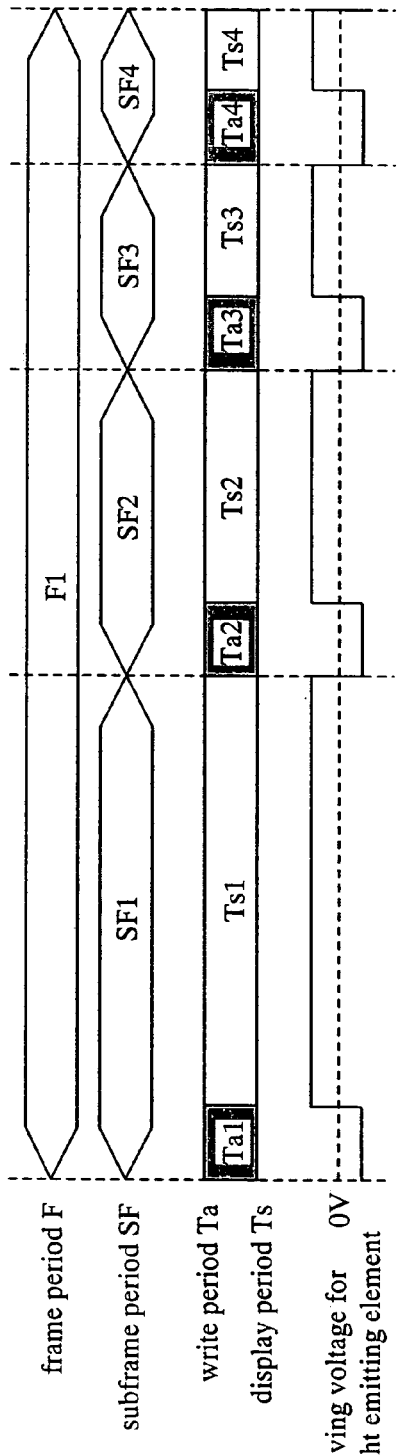
FIGS. 2A and 2B are timing charts in a digital time gray scale method of the display device according to the invention.
Figure 2B:
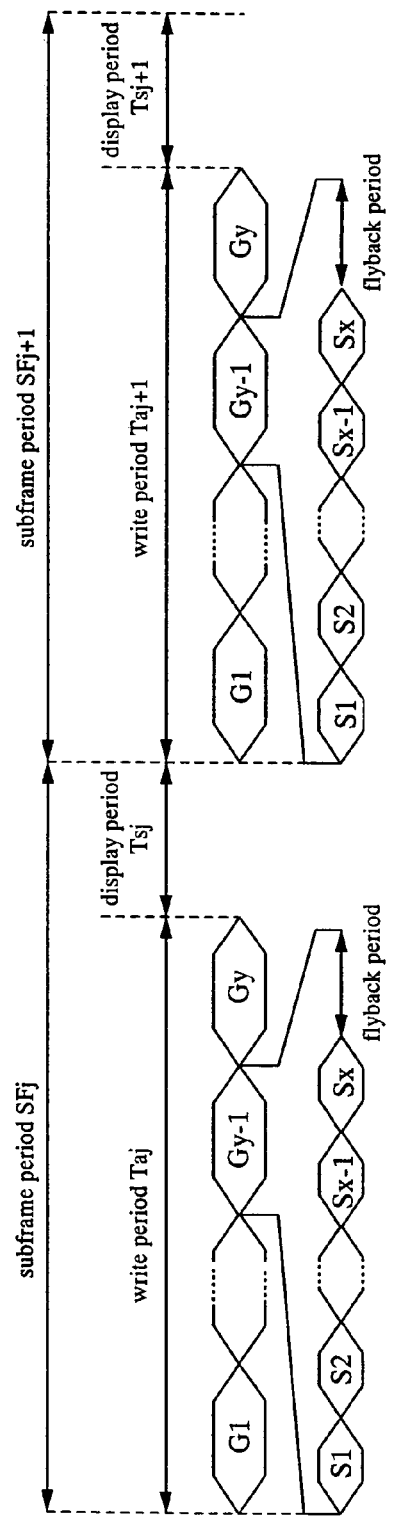

In FIGS. 2A and 2B, one frame is constituted by a plurality of subframes each of which is constituted by a write period and a display period. FIGS. 2A and 2B illustrate a gray scale display using a 4-bit digital video signal.

First, in the write period, the gate signal line G is selected and the switching transistor 101 with the gate electrode connected to the gate signal line G is turned ON. Then a digital video signal inputted to the source signal line S is inputted to the gate electrode of the driving transistor 102 through the switching transistor 101, and potential thereof is stored by the capacitor 105.

Note that, in this specification, a transistor being ON means that the state between a source electrode and a drain electrode is conductive by gate voltage. A transistor being OFF means that the source electrode and the drain electrode are nonconductive by gate voltage.

Reverse driving voltage for a light emitting element is applied to the light emitting element 104 of each pixel. That is, potential of the power source line V is fixed and potential only of the opposing electrode of the light emitting element 104 is varied. Consequently, the light emitting element 104 does not emit light and reverse bias current flowing through the light emitting element 104 flows into the current lead-in line W through the source and drain electrodes of the AC transistor 103 which is ON. Potential of the current lead-in line W at this time is set so as to prevent the reverse bias current flowing through the light emitting element 104 from flowing into the driving transistor 102.

Note that, in this specification, that forward driving voltage for a light emitting element is applied to a light emitting element means that potential of an anode of the light emitting element is made higher than potential of a cathode. At this state, forward bias current flows into the light emitting element to emit light. That reverse driving voltage for a light emitting element is applied to the light emitting element means that potential of the cathode of the light emitting element is made higher than potential of the anode. At this state, although reverse bias current flows into the light emitting element, no light is emitted.

In the display period, potential of the gate signal line G is controlled to turn OFF the switching transistor 101, and potential of the digital video signal which is written in the write period is stored by the capacitor 105. Potential of each opposing electrode of the light emitting elements 104 of all pixels is varied to apply forward driving voltage for a light emitting element into the light emitting elements 104 of all pixels. Consequently, when the driving transistor 102 is ON due to the potential stored in the capacitor 105 in the write period, current flows into the light emitting element 104 to emit light. To the contrary, when the driving transistor 102 is OFF, no current is supplied to the light emitting element 104.

The above-described operation is repeated per subframe period SF1 to SF4, so that one frame period F1 is terminated. Respective display periods Ts1 to Ts4 are arbitrarily set in the subframe periods SF1 to SF4, so that the total display period in the subframe periods SF1 to SF4 during which the light emitting element 104 emits light controls a gray scale display in one frame period F1. In other words, the gray scale is displayed depending on the total sum of light emitting periods in one frame period F1.

Figure 3A:
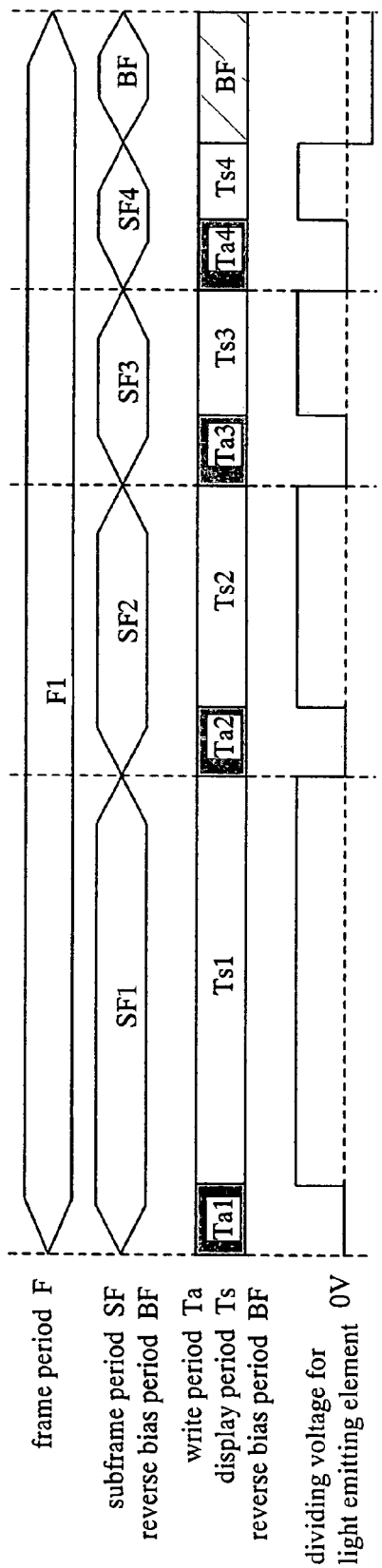
FIGS. 3A and 3B are timing charts in a digital time gray scale method of the display device according to the invention.
Figure 3B:
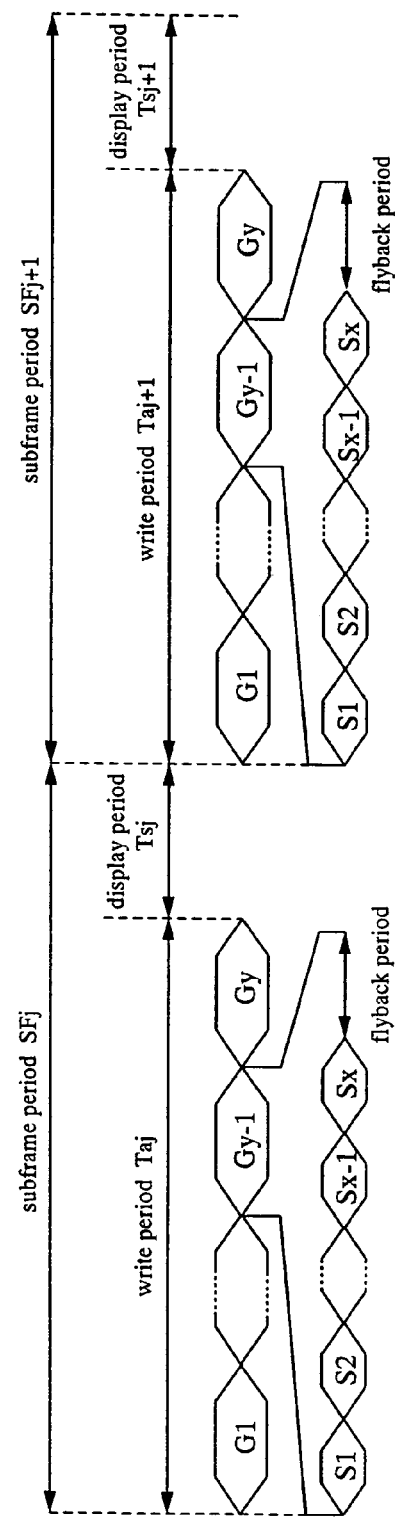

Alternatively, as shown in FIGS. 3A and 3B, it is possible to provide a period BF (a reverse bias period) for applying reverse driving voltage for a light emitting element in one frame period, and apply 0 V of driving voltage for a light emitting element in a write period. FIGS. 3A and 3B illustrate a gray scale display using a 4-bit digital video signal.

It is also possible to constitute one subframe period by a plurality of subframe periods, and the subframe periods do not have to be arranged in succession in the frame period.

In the case where the pixel shown in FIG. 1 is operated with an analog method, as shown in FIGS. 4A and 4B, a forward bias period FF that is a period for applying forward driving voltage for a light emitting element to the light emitting element, and a reverse bias period BF that is a period for applying reverse driving voltage for a light emitting element to the light emitting element are preferably provided in one frame period. An analog video signal is written to each pixel and the light emitting element 104 emits light in the forward bias period FF.

In a light emitting device according to the invention, any transistor such as a single crystalline silicon transistor, an SOI transistor, a polycrystalline silicon thin film transistor, an amorphous silicon thin film transistor, and a microcrystalline semiconductor (which includes a semi-amorphous semiconductor) thin film transistor can be employed. An organic semiconductor transistor, or a carbon nanotube transistor can be employed as well. A transistor in a pixel of the light emitting device according to the invention may be of a single gate structure, a double gate structure, or a multi-gate structure having more gate electrodes.

Note that a semi-amorphous semiconductor is of an intermediate structure between an amorphous structure and a crystalline structure (which includes a single crystalline structure and a polycrystalline structure) and has a third state which is stable in free energy, and a crystalline region which has a short-range order and a lattice distortion. The semi-amorphous semiconductor contains a crystal grain of 0.5 to 20 nm at least in a part of the film. Raman spectrum is shifted to the lower frequency band than 520 $cm^{-1}$. In addition, in the semi-amorphous semiconductor film, a diffraction peak of (111) and (220) derived from a S1 crystal lattice is observed by X-ray diffraction. The semi-amorphous semiconductor film includes at least 1 atom % or more of hydrogen or halogen as a neutralizer of a dangling bond.

The semi-amorphous semiconductor film is formed by performing glow discharging decomposition (plasma CVD) of a silicide gas. As the silicide gas, $SiH_4$, $Si_2H_6$, $SiH_2Cl_2$, $SiHCl_3$, $SiCl_4$, $SiF_4$, or the like can be used. In addition, $GeF_4$ may be mixed therein. Furthermore, the silicide gas may be diluted with $H_2$, or $H_2$ and one or more of rare gas elements: He, Ar, Kr, and Ne. Dilution ratio is within the range from 2 to 1000 times. Pressure is roughly within the range from 0.1 to 133 Pa; power frequency is from 1 to 120 MHz, preferably from 13 to 60 MHz; and substrate heating temperature is 300° C. or less, preferably from 100 to 250° C. As for an impurity element in a film, an impurity of an atmospheric constituent such as oxygen, nitrogen or carbon is preferably $1\times10^{20}$ $cm^{-1}$ or less, in particular, oxygen concentration is $5\times10^{19}/cm^3$ or less, preferably, $1\times10^{19}/cm^3$ or less. Note that the field effect mobility μ of a transistor using a semi-amorphous semiconductor is from 1 to 10 $cm^2/Vsec$.

The above-described constitution enables to flow the constant amount of current into a light emitting element when forward driving voltage for a light emitting element is applied to the light emitting element while to flow the amount of current enough to insulate a short circuit portion into the short circuit portion when reverse driving voltage for a light emitting element is applied to the light emitting element, and enables to prolong a light emitting element's life.

EMBODIMENT MODE 2

An embodiment mode of a pixel in a light emitting device of the invention is described below, which is different from FIG. 1.

Figure 5:
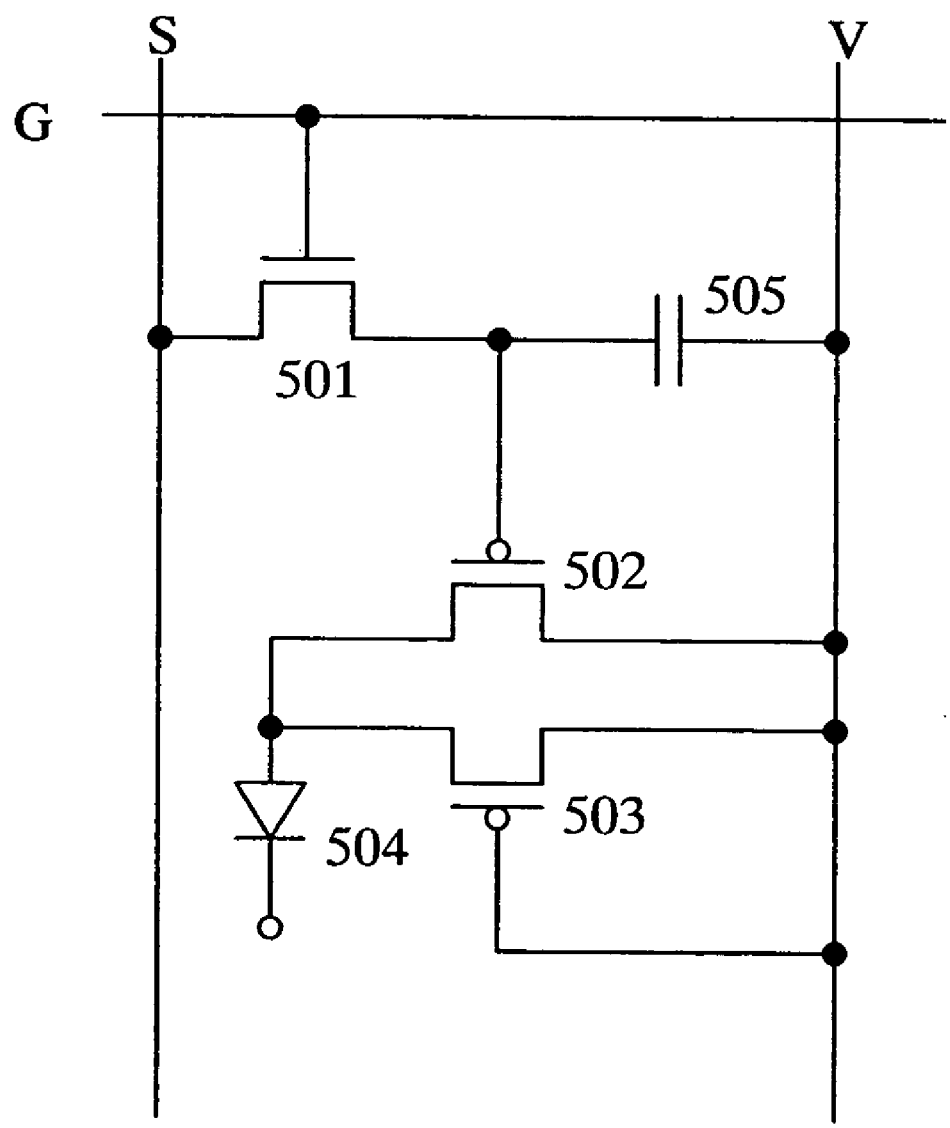
FIG. 5 is a circuit diagram of a pixel in the display device according to the invention.

A pixel shown in FIG. 5 includes a light emitting element 504, a switching transistor 501, a driving transistor 502, and an AC transistor 503. A capacitor 505 may be provided in the pixel in addition to the above elements.

The polarity of the driving transistor 502 and the AC transistor 503 are identical to each other.

In this embodiment mode, L/W of the driving transistor 502 is set larger than that of the AC transistor 503 to operate the driving transistor 502 in the saturation region and the AC transistor 503 in the linear region. More specifically, the driving transistor 502 is formed such that L is larger than W and IIW thereof is preferably 5/1 or more. The AC transistor 503 is formed such that L is equal to or smaller than W.

In FIG. 5, the switching transistor 501 is an n-channel transistor whereas the driving transistor 502 and the AC transistor 503 are p-channel transistors. However, each of the switching transistor 501, the driving transistor 502 and the AC transistor 503 may be either of a p-channel transistor or an n-channel transistor.

A gate electrode of the switching transistor 501 is connected to a gate signal line G One of a source electrode and a drain electrode of the switching transistor 501 is connected to a source signal line S while the other is connected to a gate electrode of the driving transistor 502. The driving transistor 502 is connected to a power source line V and the light emitting element 504 so as to supply current from the power source line V to the light emitting element 504 as drain current of the driving transistor 502. In this embodiment mode, a gate electrode of the AC transistor 503 is connected to the power source line V, and one of a source electrode and a drain electrode thereof is connected to the power source line V while the other is connected to a pixel electrode of the light emitting element 504.

The light emitting element 504 is structured by an anode, a cathode, and an electroluminescent layer interposed therebetween. In FIG. 5, since the anode is connected to the driving transistor 502, the anode corresponds to a pixel electrode and the cathode corresponds to an opposing electrode.

Two electrodes of the capacitor 505 are connected to the power source line V and a gate electrode of the driving transistor 502 respectively. The capacitor 505 is provided for storing potential difference between electrodes of the capacitor 505 during the switching transistor 501 is OFF. Note that although the capacitor 505 is provided in FIG. 5, the invention is not limited to this configuration and the capacitor 505 is not necessarily provided.

In FIG. 5, the driving transistor 502 and the AC transistor 503 are p-channel transistors and the drain electrode of the driving transistor 502 and the anode of the light emitting element 504 are connected to each other. Instead, when the driving transistor 502 and the AC transistor 503 are n-channel transistors, the source electrode of the driving transistor 502 and the cathode of the light emitting element 504 are connected to each other. In the latter case, the cathode of the light emitting element 504 corresponds to a pixel electrode and the anode corresponds to an opposing electrode.

A digital time gray scale method by using the pixel shown in FIG. 5 is also performed in accordance with the timing charts in FIGS. 2A and 2B or FIGS. 3A and 3B, as is described in Embodiment Mode 1.

In the case where the pixel shown in FIG. 5 is operated with an analog method, as shown in FIGS. 4A and 4B, a forward bias period FF that is a period for applying forward driving voltage for a light emitting element to the light emitting element, and a reverse bias period BF that is a period for applying reverse driving voltage for a light emitting element to the light emitting element are preferably provided in one frame period, as is described in Embodiment Mode 1. An analog video signal is written to each pixel and the light emitting element 504 emits light in the forward bias period FF.

The above-described configuration enables to flow a constant amount of current into a light emitting element when forward driving voltage for a light emitting element is applied to the light emitting element while to flow the amount of current enough to insulate a short circuit portion into the short circuit portion when reverse driving voltage for a light emitting element is applied to the light emitting element, and enables to prolong a light emitting element's life.

Embodiments of the invention are described hereinafter.

EMBODIMENT 1

Figure 6:
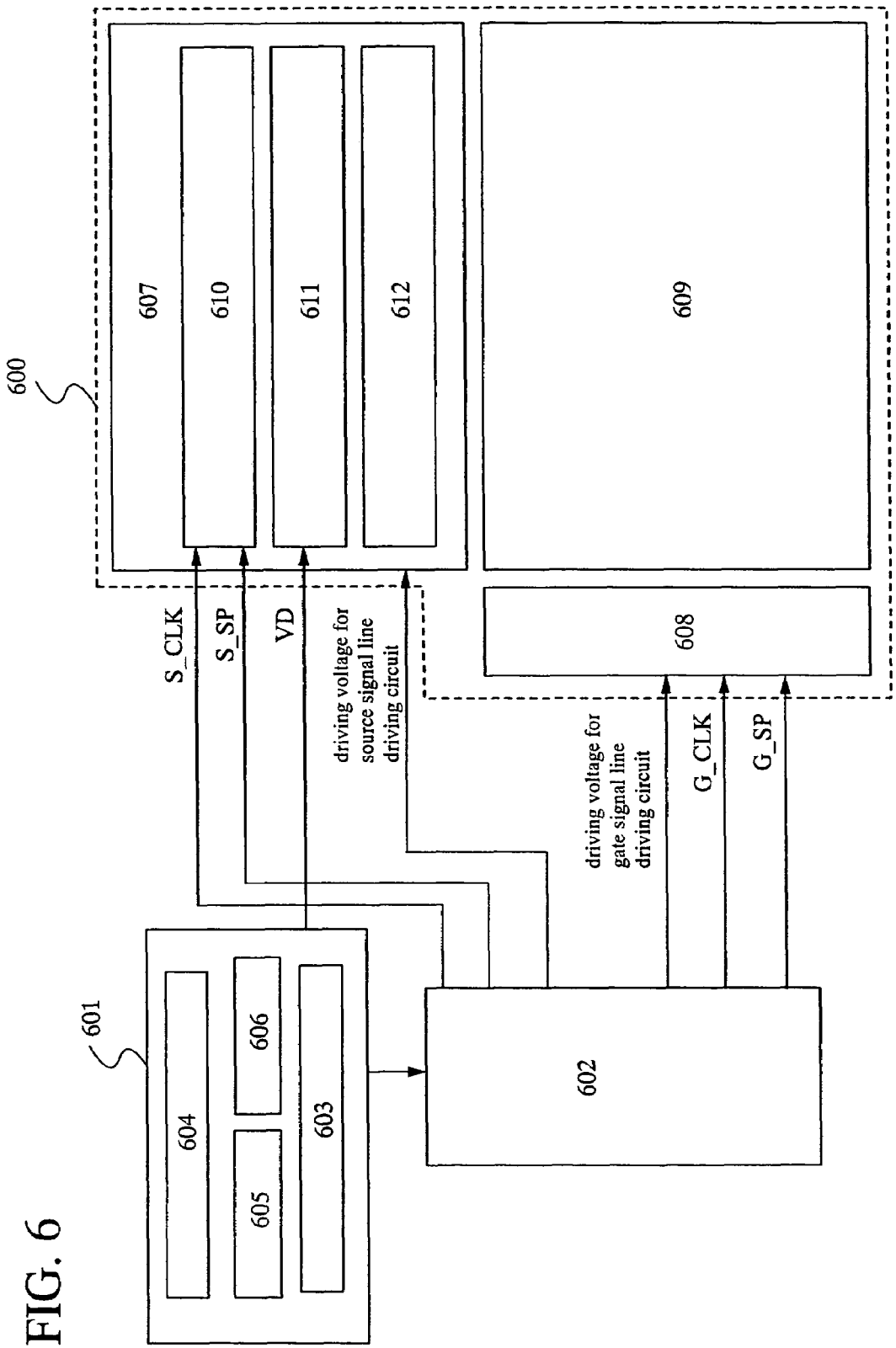
FIG. 6 is a circuit diagram showing a constitution of the display device according to the invention (Embodiment 1).

Described with reference to FIG. 6 is a circuit for inputting signals to a source signal line driving circuit and a gate signal line driving circuit of a display to operate the display with a digital time gray scale method.

In this embodiment, a display device inputted with a 4-bit digital video signal to display an image is described. Note that the invention is not limited to a case of 4-bit.

A signal control circuit 601 is inputted with digital video signals and outputs digital video signals VD to a display 600.

In this embodiment, digital video signals are compiled in the signal control circuit 601. A digital video signal after being converted to be inputted to a display is called a digital video signal VD.

Signals and driving voltage for operating a source signal line driving circuit 607 and a gate signal line driving circuit 608 of the display 600 are inputted by a display controller 602.

Respective configurations of the signal control circuit 601 and the display controller 602 are described below.

Note that the source signal line driving circuit 607 comprises a shift register 610, a latch circuit A 611, and a latch circuit B 612. Besides, a level shifter, a buffer, or the like may be provided, though not shown in FIG. 6. Note that the invention is not limited to this configuration. Reference numeral 609 denotes a pixel portion.

The signal control circuit 601 comprises a CPU 604, a memory A 605, a memory B 606, and a memory controller 603.

Digital video signals inputted into the signal control circuit 601 are inputted to the memory A 605 through a switch, which are controlled by the memory controller 603. Note that the memory A 605 has enough capacity to store digital video signals for all pixels of the display 600. When signals for one frame period are stored in the memory A 605, a signal of each bit is read out one by one to be inputted to the source signal line driving circuit 607 as a digital video signal VD by the memory controller 603.

When signals of the memory A 605 start being read out, digital video signals for the following frame period start being inputted to be stored in the memory B 606 through the memory controller 603. The memory B 606 has enough capacity to store digital video signals for all pixels of the display device as well as the memory A 605.

The signal control circuit 601 comprises the memory A 605 and the memory B 606 each capable of storing digital video signals for one frame period so that a digital video signal VD is sampled by alternately using the memory A 605 and the memory B 606, as described hereinabove.

Described in this embodiment is the signal control circuit 601 in which signals are stored by alternately using the memory A 605 and the memory B 606. Generally, a display device comprises a plurality of memories each storing data for a plurality of frames, which can be used alternately.

Figure 7:
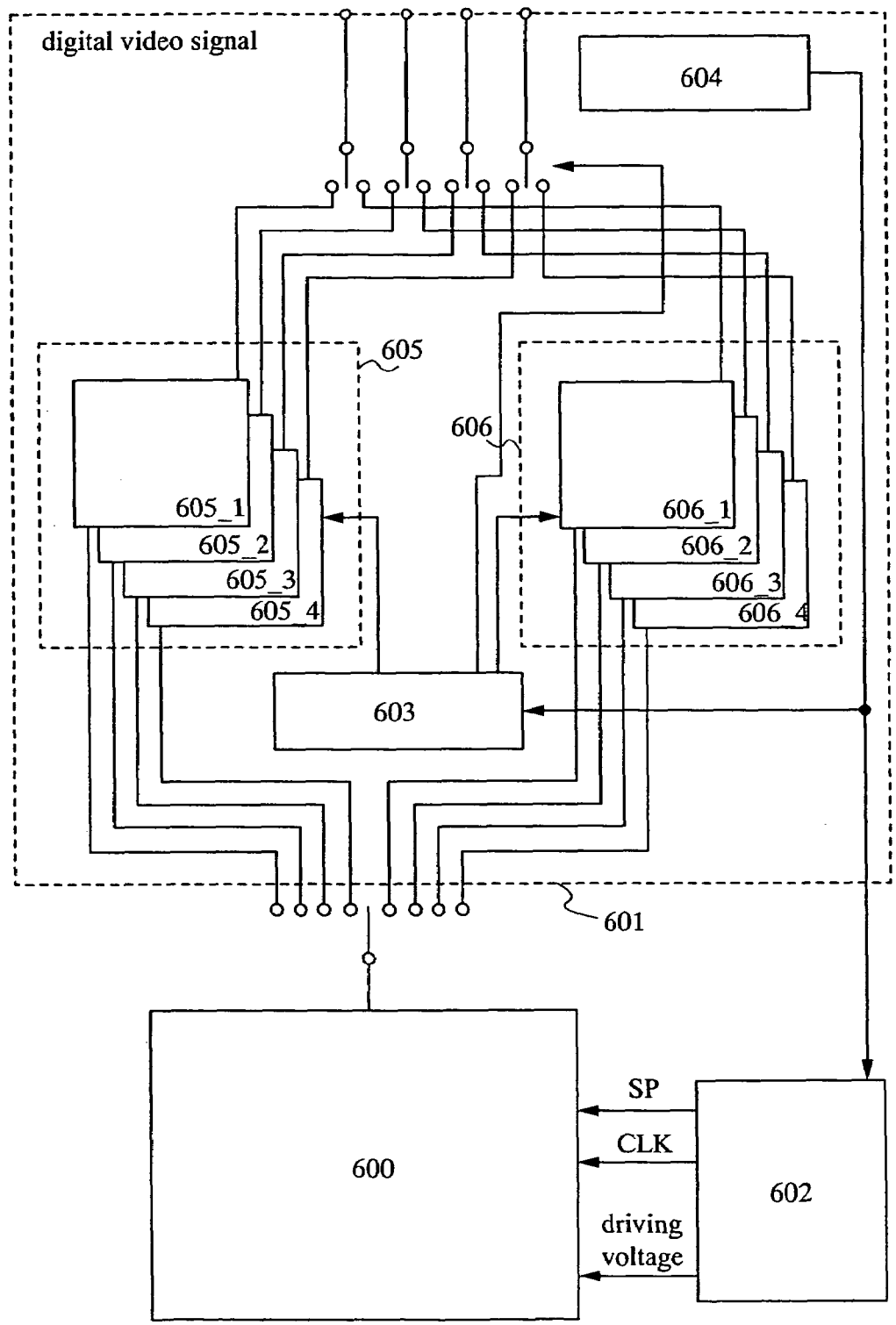
FIG. 7 is a block diagram showing a constitution of the display device according to the invention (Embodiment 1).

FIG. 7 is a block diagram of a display device with the above-described configuration.

The display device comprises the signal control circuit 601, the display controller 602, and the display 600.

The display controller 602 supplies a start pulse SP, a clock pulse CLK, driving voltage, and the like to the display 600.

The signal control circuit 601 comprises the CPU 604, the memory A 605, the memory B 606, and the memory controller 603.

The memory A 605 is constituted by memories 605_1 to 605_4 which store data for the first bit to the forth bit of the digital video signal respectively. Similarly, the memory B 606 is constituted by memories 606_1 to 606_4 which store data for the first bit to the forth bit respectively. The memory for each bit comprises a plurality of storage elements such that a signal for one bit is stored for all pixels of one screen.

Generally, in a display device capable of displaying a gray scale by using an n-bit digital video signal, the memory A 605 is constituted by memories 605_1 to 605_n which store data for the first bit to the n-th bit respectively. Similarly, the memory B 606 is constituted by memories 606_1 to 606_n which store data for the first bit to the n-th bit respectively. The memory for each bit has enough capacity such that a signal for one bit is stored for all pixels of one screen.

A constitution of the display controller 602 is described below.

Figure 8:
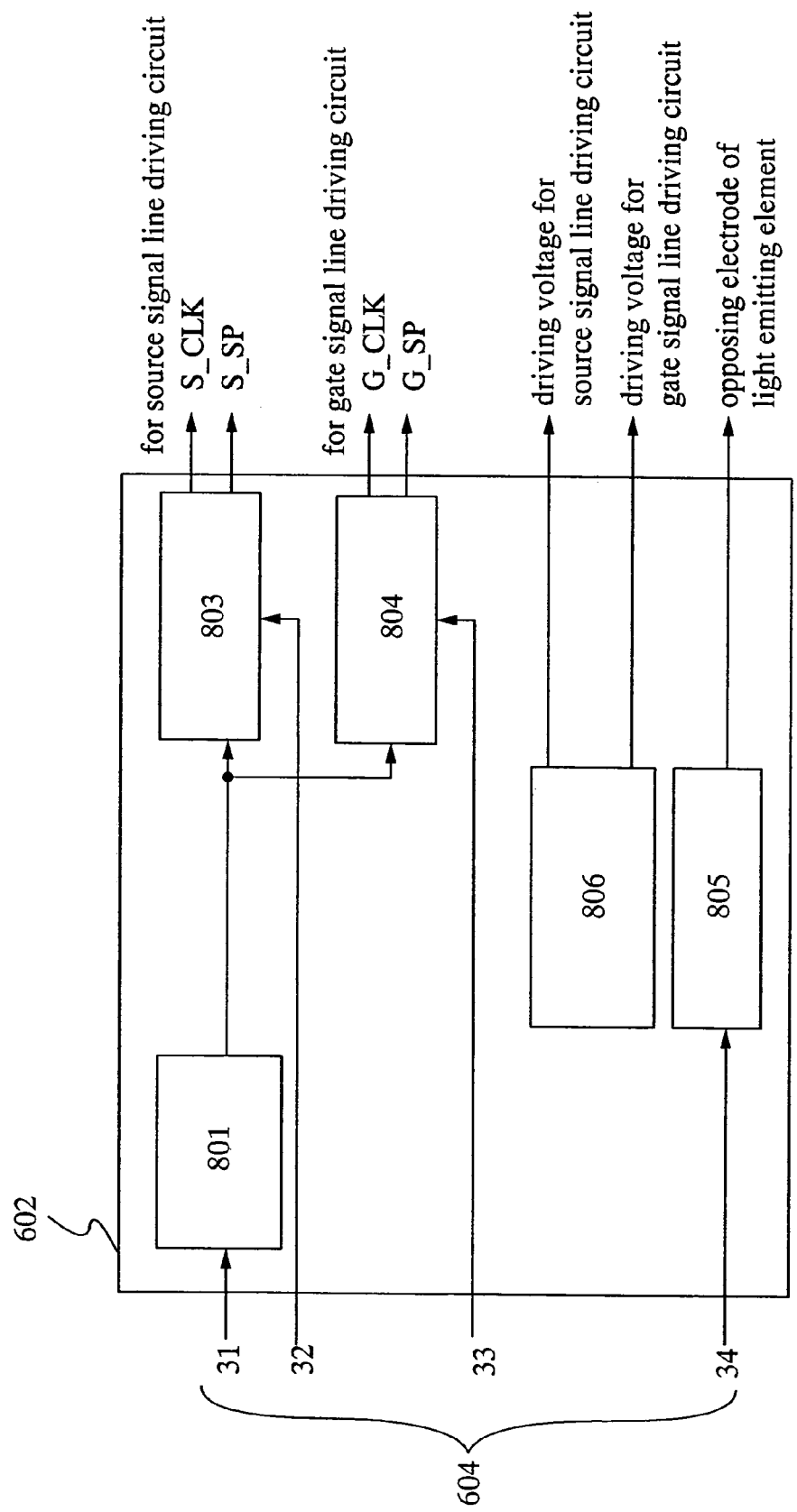
FIG. 8 is a diagram showing a constitution of a display controller in the display device according to the invention (Embodiment 1).

FIG. 8 is a diagram of a constitution of a display controller of the invention.

The display controller 602 comprises a reference clock generating circuit 801, a horizontal clock generating circuit 803, a vertical clock generating circuit 804, a power supply control circuit 805 for a light emitting element, and a power supply control circuit 806 for a driving circuit.

A clock signal 31 from a CPU 604 is inputted to the reference clock generating circuit 801 to generate a reference clock. The reference clock is inputted to the horizontal clock generating circuit 803 and the vertical clock generating circuit 804.

In addition, the horizontal clock generating circuit 803 is inputted with a horizontal cycle signal 32 for determining a horizontal cycle from the CPU 604, and outputs a clock pulse S_CLK and a start pulse S_SP for a source signal line driving circuit. The vertical clock generating circuit 804 is inputted with a vertical cycle signal 33 for determining a vertical cycle from the CPU 604, and outputs a clock pulse G_CLK and a start pulse G_SP for a gate signal line driving circuit.

The power supply control circuit for a light emitting element 805 is controlled by a power supply control signal 34 for a light emitting element. In the case of the timing charts shown in FIGS. 2A and 2B being adopted, the power supply control circuit for a light emitting element 805 controls potential of an opposing electrode of a light emitting element (opposing potential) such that reverse driving voltage for a light emitting element is applied to the light emitting element in the write period Ta whereas forward driving voltage for a light emitting element is applied to the light emitting element in the display period Ts. In the case of the timing charts shown in FIGS. 3A and 3B being adopted, the power supply control circuit for a light emitting element 805 controls the opposing potential such that driving voltage for a light emitting element of 0V is applied to the light emitting element in the write period Ta, forward driving voltage for a light emitting element is applied to the light emitting element in the display period Ts, and reverse driving voltage for a light emitting element is applied to the light emitting element in the reverse bias period BF.

The power supply control circuit 806 for a driving circuit controls power supply voltage for each driving circuit.

Note that the power supply control circuit 806 for a driving circuit can adopt a known configuration.

As for the signal control circuit 601, the memory controller 603, the CPU 604, the memories A 605 and B 606, the display controller 602, they may be integrally formed on the same substrate with the pixel, or may be formed by LSI chips and then attached onto a substrate of the display 600 with COG or TAB, or may be formed on another substrate different from that of the display 600 so as to integrally form with the display 600 and connected to each other by using an electric wiring.

EMBODIMENT 2

Figure 9:
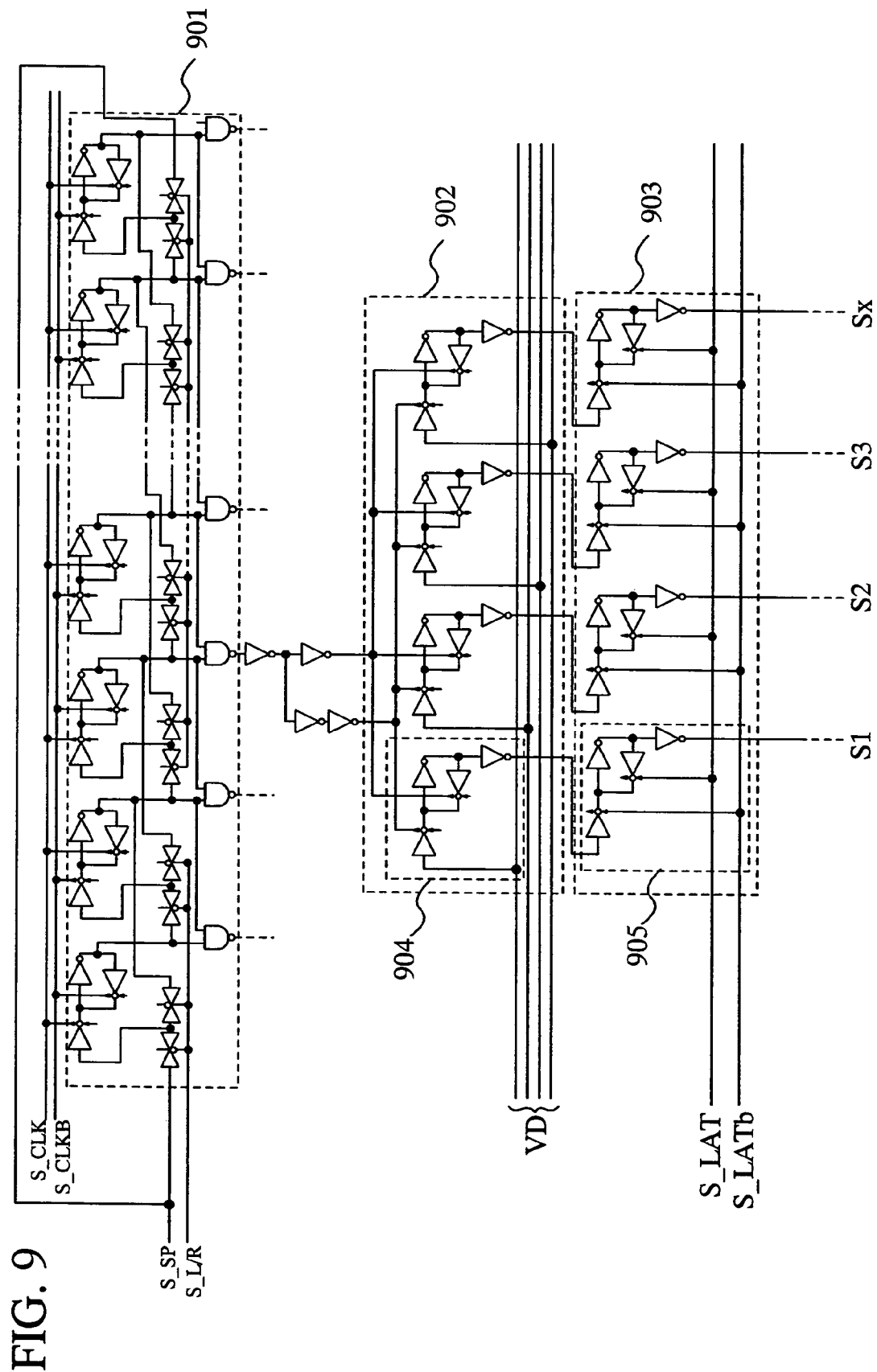
FIG. 9 is a diagram showing a constitution of a source signal line driving circuit in the display device according to the invention (Embodiment 2).

This embodiment describes a constitution of a source signal line driving circuit for a digital time gray scale method in the display device of the invention. An example of the constitution of the source signal line driving circuit is shown in FIG. 9.

The source signal line driving circuit comprises a shift register 901, a scanning direction switching circuit, a latch circuit A 902, and a latch circuit B 903. As for each of the latch circuit A 902 and the latch circuit B 903, only a corresponding part to one of outputs from the shift register 901 is illustrated in FIG. 9, and respective latch circuits A 902 and latch circuits B 903 are provided to all of the outputs from the shift register 901.

The shift register 901 is constituted by a clocked inverter, an inverter, and a NAND. A start pulse S_SP for the source signal line driving circuit is inputted to the shift register 901. By changing the state of the clocked inverter between a conductive state and a non-conductive state in accordance with a clock pulse S_CLK for the source signal line driving circuit and an inverted clock pulse S_CLKB for the source signal line driving circuit which has inverse polarity to that of the clock pulse S_CLK, sampling pulses are outputted sequentially from the NAND to the latch circuit A 902.

The scanning direction switching circuit is constituted by a switch, which serves to switch the operation direction of the shift register 901 between left and right in the drawing. In FIG. 9, the shift register 901 outputs sampling pulses sequentially from the left to the right in the drawing in the case of a left and right switching signal L/R corresponding to a Lo signal. To the contrary, in the case of a left and right switching signal L/R corresponding to a Hi signal, then sampling pulses are outputted sequentially from the right to the left in the drawing.

Each stage of the latch circuit A 902 means the latch circuit A 904 for taking in a video signal to be inputted to one source signal line in this embodiment.

The latch circuit A 904 is constituted by a clocked inverter and an inverter.

In the latch circuit A 902, a digital video signal VD outputted from the signal control circuit, which is explained in Embodiment Mode 1, is inputted in p divisions (p is a positive integer). That is, respective signals corresponding to outputs to p source signal lines are inputted in parallel. Sampling pulses are inputted at the same time to the clocked inverters of p latch circuit A 904 through buffers, so that the respective input signals of p divisions are sampled simultaneously in the p latch circuit A 904.

A source signal line driving circuit for outputting signal voltage to x source signal lines is described here, and therefore x/p sampling pulses are outputted sequentially from the shift register per one horizontal period. The p latch circuit A 904 simultaneously sample respective digital video signals corresponding to outputs to the p source signal lines in accordance with each sampling pulse.

In this embodiment, a method called a p-division drive is that a digital video signal inputted to the source signal line driving circuit is divided into parallel signals of p phases and the p digital video signals are taken simultaneously in accordance with one sampling pulse. A 4-division drive is shown in FIG. 9.

The sampling in the shift register of the source signal line driving circuit can be carried out with some margin according to the above-mentioned division drive. The reliability of a display device can thus be enhanced.

When all signals for one horizontal period are inputted to each latch circuit A 904, a latch pulse S_LAT and an inverted latch pulse S_LATB which has inverse polarity to the latch pulse S_LAT are inputted to simultaneously output the respective signals to each stage of the latch circuit B 903.

Note that each stage of the latch circuit B 903 means a latch circuit B 905 to which the signal from each stage of the latch circuit A 902 is inputted in this embodiment.

Each latch circuit B 905 is constituted by a clocked inverter and an inverter. Each latch circuit B 905 stores respective signals from each latch circuit A 904 and then outputs to respective source signal lines S1 to Sx.

Note that, a level shifter, a buffer, or the like may be provided as required, though not shown in FIG. 9.

Signals such as the start pulse S_SP and the clock pulse S_CLK to be inputted to the shift register 901, the latch circuit A 902, and the latch circuit B 903 are inputted from the display controller described in embodiment 1 of the invention.

In this embodiment, an operation for inputting a digital video signal to a latch circuit A of a source signal line driving circuit is controlled by a signal control circuit. In addition, operations for inputting the clock pulse S_CLK and the start pulse S_SP to a shift register of the source signal line driving circuit, and for inputting driving voltage for operating the source signal line driving circuit are controlled by a display controller.

Note that, in the display device according to the invention, the source signal line driving circuit is not limited to the constitution described in this embodiment and can adopt any one of known constitutions.

The number of signal lines for inputting from the display controller to the source signal line driving circuit and the number of power source lines for driving voltage depend on the configuration of the source signal line driving circuit.

This embodiment can be implemented in free combination with the above-described embodiment modes and embodiment.

EMBODIMENT 3

Figure 10:
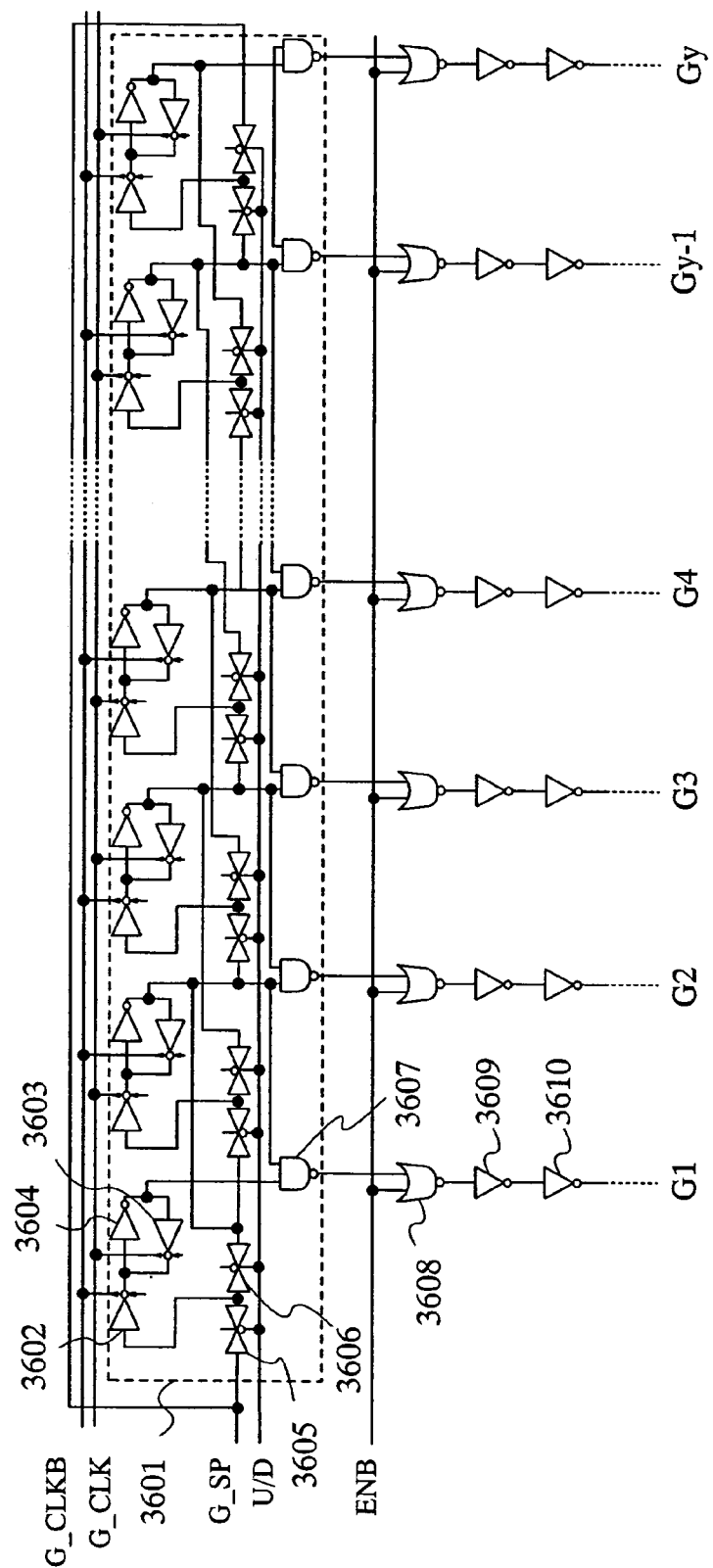
FIG. 10 is a diagram showing a constitution of a gate signal line driving circuit in the display device according to the invention (Embodiment 3).

This embodiment describes a constitution of a gate signal line driving circuit of the display device of the invention with reference to FIG. 10.

The gate signal line driving circuit is constituted by a shift register, a scanning direction switching circuit, and the like. Besides, a level shifter, a buffer, or the like may be provided, though not shown in FIG. 10.

A shift register is inputted with a start pulse G_SP, a clock pulse G_CLK, driving voltage and the like and outputs a gate signal line selecting signal.

A shift register 3601 is constituted by clocked inverters 3602 and 3603, an inverter 3604, and a NAND 3607. A start pulse G_SP is inputted to the shift register 3601. By changing the states of the clocked inverters 3602 and 3603 between a conductive state and a non-conductive state in accordance with a clock pulse G_CLK and an inverted clock pulse G_CLKB which has inverse polarity to that of the clock pulse G_CLK, sampling pulses are outputted sequentially from the NAND 3607.

The scanning direction switching circuit is constituted by switches 3605 and 3606, which serves to switch the operation direction of the shift register 3601 between left and right in the drawing. In FIG. 10, the shift register 3601 outputs sampling pulses sequentially from the left to the right in the drawing in the case of a scanning direction switching signal U/D corresponding to a Lo signal. To the contrary, in the case of a scanning direction switching signal U/D corresponding to a Hi signal, sampling pulses are outputted sequentially from the right to the left in the drawing.

Sampling pulses outputted from the shift register 3601 are inputted to a NOR 3608 and calculated with enable signals ENB. The purpose of this calculation is to avoid an error of selecting adjacent gate signal lines simultaneously due to dullness of the sampling pulses. Signals outputted from the NOR 3608 are outputted to respective gate signal lines G1 to Gy through buffers 3609 and 3610.

Note that, a level shifter, a buffer, or the like may be provided as required, though not shown in FIG. 10.

The start pulse G_SP, the clock pulse G_CLK, the driving voltage and the like to be inputted to the shift register 3601 are inputted from the display controller described in Embodiment Mode 1.

Note that, in the display device according to the invention, the gate signal line driving circuit is not limited to the constitution described in this embodiment and can adopt any one of known constitutions.

The number of signal lines for inputting from the display controller to the gate signal line driving circuit and the number of power source lines for driving voltage depend on the constitution of the gate signal line driving circuit.

This embodiment can be implemented in free combination with the above-described embodiment modes and embodiments.

EMBODIMENT 4

A display mounted with a pixel portion and a driving circuit is described with reference to FIGS. 11A to 13, which is one embodiment of a display device of the invention.

Figure 11A:
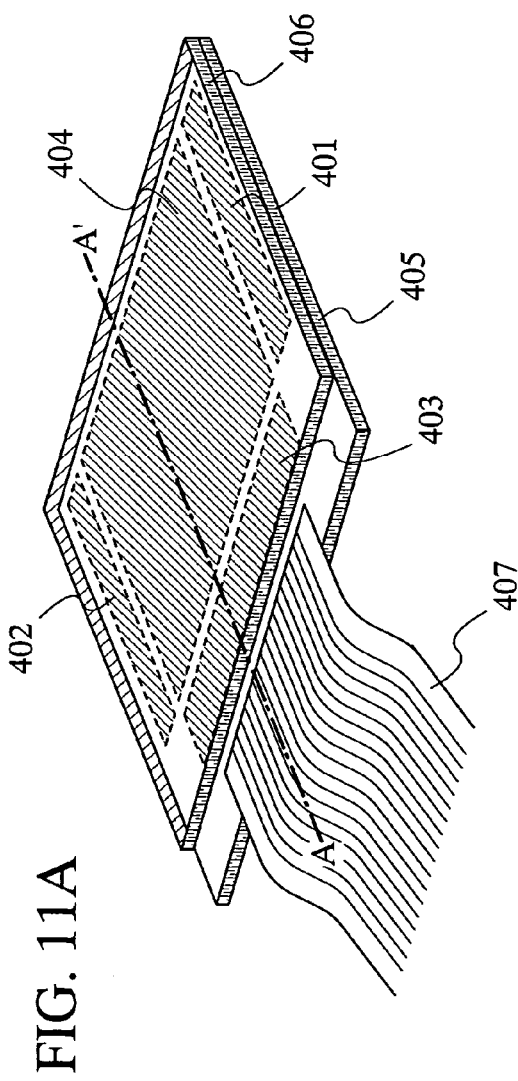
FIGS. 11A and 11B is a perspective view and a view showing a cross section of the display device according to the invention (Embodiment 4).
Figure 11B:
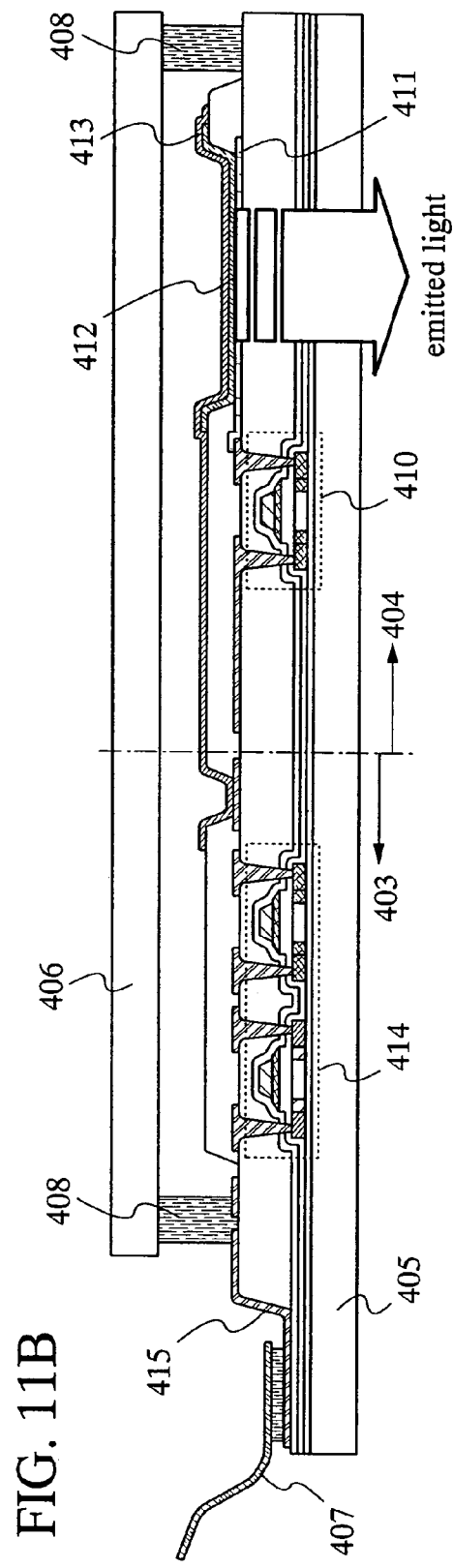

In FIGS. 11A and 11B, a pixel portion 404 having a plurality of pixels each including a light emitting element, a source signal line driving circuit 403, first and second gate signal line driving circuits 401 and 402, a connecting terminal 415, and a connecting film 407 are provided on a substrate 405. The connecting terminal 415 is connected to the connecting film 407 through anisotropic conductive particles and the like. The connecting film 407 is connected to an IC chip.

FIG. 11B is a cross-sectional view of the panel shown in FIG. 11A along a line A-A', illustrating a driving transistor 410 in the pixel portion 404 and a CMOS circuit 414 in the source signal line driving circuit 403. In addition, a conductive layer 411, an electroluminescent layer 412, and a conductive layer 413 in the pixel portion 404 are illustrated. The conductive layer 411 is connected to a source electrode or a drain electrode of the driving transistor 410 and serves as a pixel electrode whereas the conductive layer 413 serves as an opposing electrode. The conductive layer 411, the electroluminescent layer 412, and the conductive layer 413 are laminated to form a light emitting element.

A sealing material 408 is provided in the periphery of the pixel portion 404 and the driving circuits 401 to 403, thereby the light emitting element is sealed with the sealing material 408 and an opposing substrate 406. Sealing is carried out to protect the light emitting element from moisture. A method for sealing with a cover material (e.g., glass, ceramics, plastic, and metal) is adopted here, however, a method for sealing with thermosetting resin or UV curable resin, or a method for sealing with a thin film having a high barrier property made of metal oxide, nitride, and the like may be adopted as well.

An element formed over the substrate 405 is preferably formed by a crystalline semiconductor (polysilicon) having more favorable properties such as mobility than an amorphous semiconductor, and therefore, monolithic on the same surface can be realized. According to the above-described structure, miniaturization, lightweight, and thinness of a panel can be achieved since the number of external ICs to be connected is reduced.

In FIG. 11B, the conductive layer 411 is formed of a transparent conductive film and the conductive layer 413 is formed of a reflective film. Light emitted from the electroluminescent layer 412 is emitted to the substrate 405 side through the conductive layer 411 as indicated by an arrow. Such a structure is generally called a bottom emission structure.

To the contrary, a structure as shown in FIG. 12A can be adopted in that the conductive layer 411 is formed of a reflective film and the conductive layer 413 is formed of a transparent conductive film, and light emitted from the electroluminescent layer 412 is emitted to the opposing substrate 406 side. Such a structure is generally called a top emission structure.

A source electrode or a drain electrode of the driving transistor 410 and the conductive layer 411 are laminated on a layer without interposing an insulating film so that they are connected to each other directly by being overlapped. Therefore, the conductive film 411 is formed in a region except a region in which the driving transistor 410 is formed. Accordingly, an aperture ratio is inevitably decreased as high definition and the like of a pixel are developed. In view of this, an interlayer film 416 is additionally provided, a pixel electrode is formed on a separate layer, and a top emission structure is adopted as shown in FIG. 12B, so that a region in which a transistor and the like are formed can be utilized as a light emitting region efficiently. Although depending on the thickness of the electroluminescent layer 412, the conductive layer 411 and the conductive layer 413 may be short-circuited at the contact region between the conductive layer 411 and the source electrode or the drain electrode of the driving transistor 410, therefore a bank 417 and the like are preferably provided to prevent the short circuit.

Figure 13:
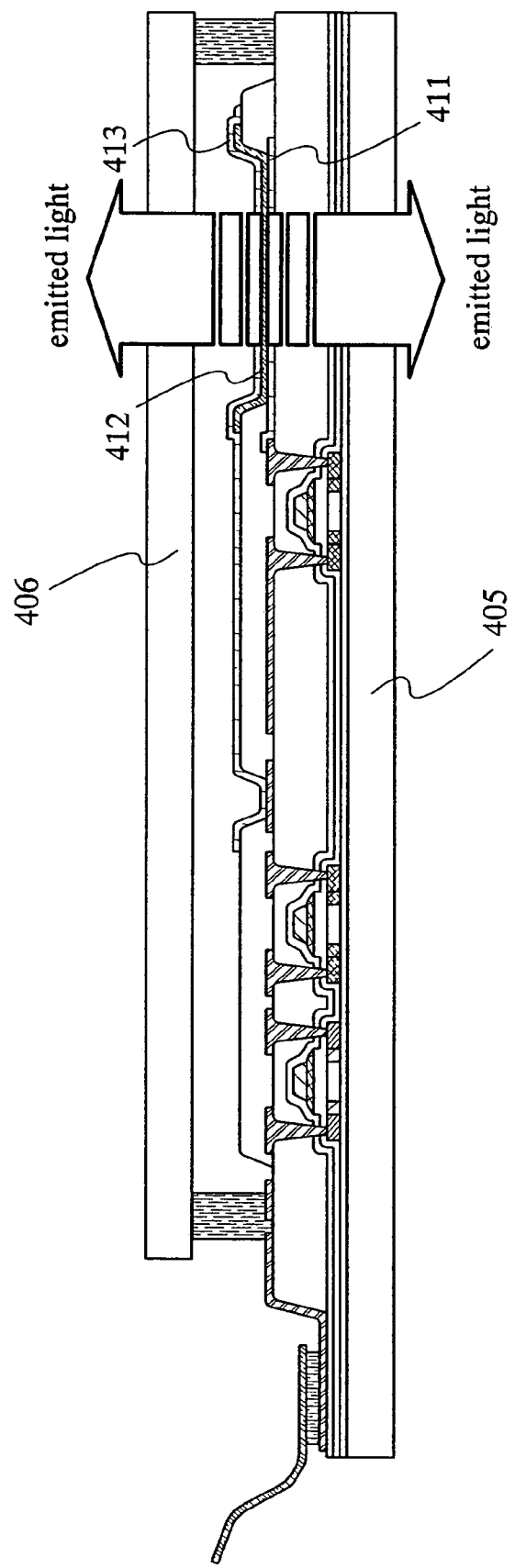
FIG. 13 is a view showing a cross section of a display device according to the invention (Embodiment 4).

Alternatively, a structure as shown in FIG. 13 can be adopted in that the conductive layer 411 and the conductive layer 413 are both formed of transparent conductive films, and light emitted from the electroluminescent layer 412 is emitted to both of the substrate 405 side and the opposing substrate 406 side. Such a structure is generally called a dual emission structure.

In the case of FIG. 13, respective light emission areas are approximately equal to each other in the top emission side and the bottom emission side, however, providing an interlayer film additionally to increase the area of a pixel electrode enables to increase an aperture ratio of the top emission side, of course.

Note that the invention is not limited to the above-described embodiments. For example, it is possible to constitute the pixel portion 404 by a transistor whose channel region is formed of an amorphous semiconductor (amorphous silicon) on an insulating surface and to constitute the driving circuits 401 to 403 by an IC chip. The IC chip may be attached onto the substrate by a COG method or a connecting film which is connected to the substrate. The amorphous semiconductor can be formed on a large substrate by a CVD method and does not require crystallization, which enables to provide an inexpensive panel. Furthermore, in the case of the conductive layer being formed by a droplet ejection method typified by an ink jetting method, more inexpensive panel can be provided. This embodiment can be implemented in free combination with the above-described embodiment modes and embodiments.

EMBODIMENT 5

Figure 14:
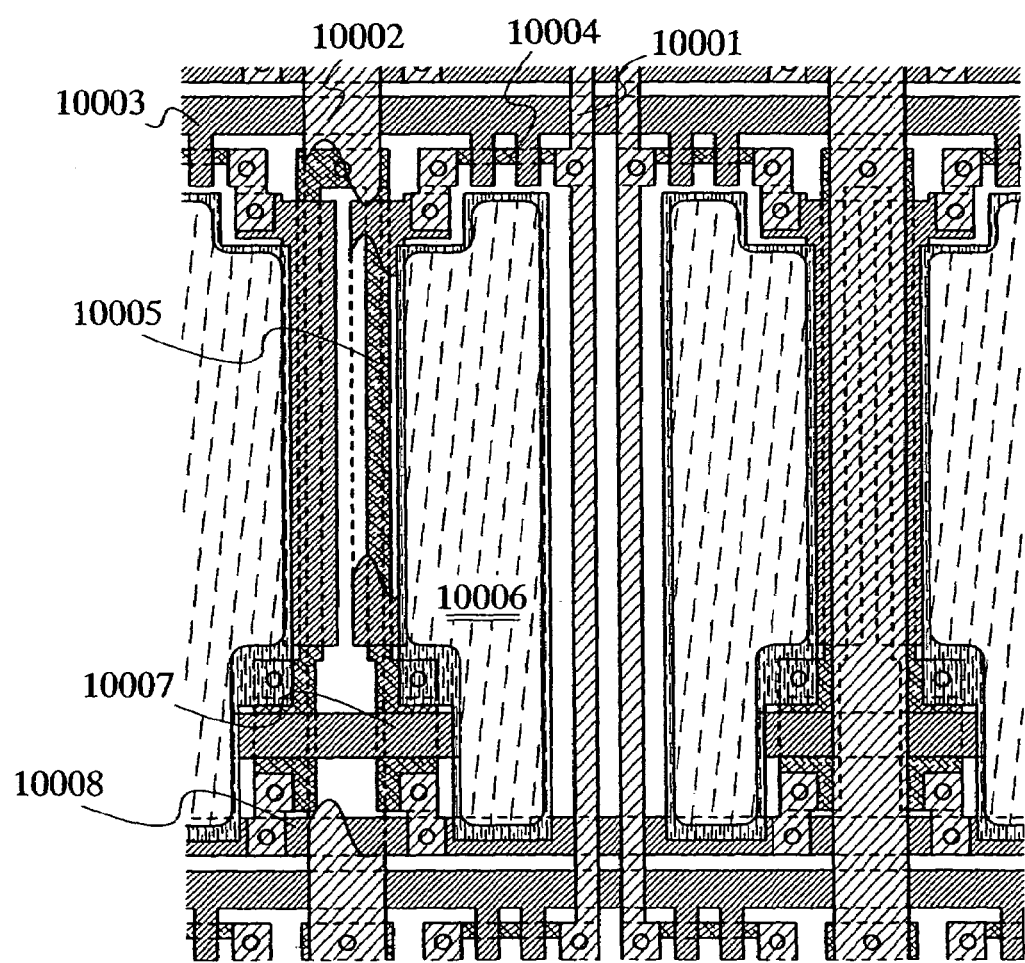
FIG. 14 is a layout view of pixels according to the invention (Embodiment 5).

FIG. 14 shows a layout of the circuit configuration of FIG. 1 which is one embodiment mode of the invention.

The layout shown in FIG. 14 includes a source signal line 10001, a power source line 10002, a gate signal line 10003, a switching transistor 10004, a driving transistor 10005, a pixel electrode 10006, an AC transistor 10007, and a current lead-in line 10008. These elements and lines correspond to respective ones having the same name in FIG. 1.

Note that a display device of the invention is not limited to the constitution of the layout of this embodiment.

This embodiment can be implemented in free combination with the above-described embodiment modes and embodiments.

EMBODIMENT 6

A light emitting device employing a light emitting element emits light by itself, therefore, it exhibits superior visibility under bright light and a wider viewing angle as compared with a liquid crystal display. Accordingly, a light emitting device of the invention can be applied to various electronic apparatuses.

The light emitting device of the invention can be applied to various electronic apparatuses such as a video camera, a digital camera, a goggle type display (a head mounted display), a navigation system, an audio reproducing device (an in-car audio system, a component stereo, or the like), a notebook personal computer, a game player, a portable data terminal (a mobile computer, a mobile phone, a portable game player, an electronic book, or the like), and an image reproducing device provided with a recording medium (specifically, a device which is capable of reproducing a recording medium such as a DVD (Digital Versatile Disc) and which includes a display for displaying the reproduced image). In particular, the light emitting device having a light emitting element is desirably used for a portable data terminal which requires a wide viewing angle because whose screen is seen from an oblique direction in many cases. Specific examples of such electronic apparatuses are illustrated in FIGS. 15A to 15H.

Figure 15A:
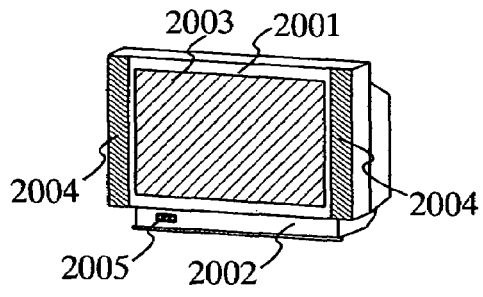
FIGS. 15A to 15H are views of electronic apparatuses each employing the display device according to the invention (Embodiment 6).

FIG. 15A illustrates a display device which includes a housing 2001, a supporting base 2002, a display portion 2003, speaker portions 2004, a video input terminal 2005 and the like. The light emitting device of the invention can be applied to the display portion 2003 to complete the display device. Since the light emitting device having a light emitting element emits light by itself and requires no backlight, the display portion thereof can be made thinner than a liquid crystal display. Note that the display device includes all the data display devices such as one used for personal computer, TV broadcast receiving, or advertisement display.

Figure 15B:
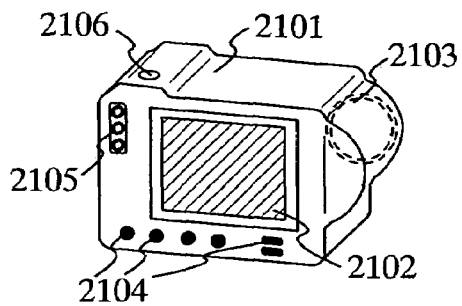

FIG. 15B illustrates a digital still camera which includes a main body 2101, a display portion 2102, an image receiving portion 2103, operating keys 2104, an external connecting port 2105, a shutter 2106 and the like. The light emitting device of the invention can be applied to the display portion 2102 to complete the digital still camera.

Figure 15C:
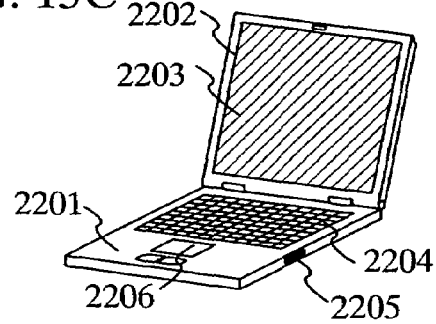

FIG. 15C illustrates a notebook personal computer which includes a main body 2201, a housing 2202, a display portion 2203, a keyboard 2204, an external connecting port 2205, a pointing mouse 2206 and the like. The light emitting device of the invention can be applied to the display portion 2203 to complete the notebook personal computer.

Figure 15D:
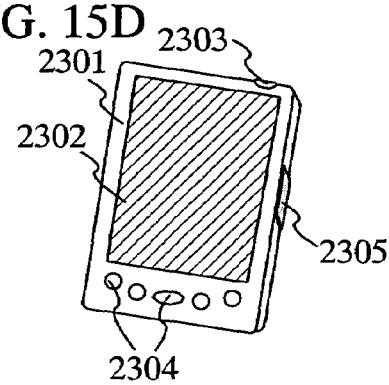

FIG. 15D illustrates a mobile computer which includes a main body 2301, a display portion 2302, a switch 2303, an operating keys 2304, an infrared port 2305 and the like. The light emitting device of the invention can be applied to the display portion 2302 to complete the mobile computer.

Figure 15E:
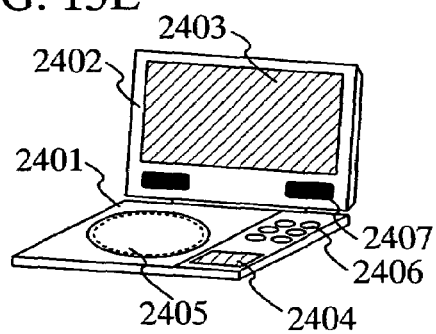

FIG. 15E illustrates a portable image reproducing device provided with a recording medium (specifically, a DVD reproducing device), which includes a main body 2401, a housing 2402, a display portion A 2403, a display portion B 2404, a recording medium (e.g., DVD) reading portion 2405, operating keys 2406, a speaker portion 2407 and the like. The display portion A 2403 mainly displays image data whereas the display portion B 2404 mainly displays character data. The light emitting device of the invention can be applied to the display portions A 2403 and B 2404 to complete the image reproducing device. Note that the image reproducing device provided with a recording medium includes a home game player and the like.

Figure 15F:
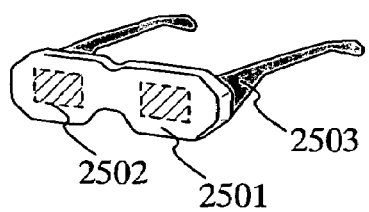

FIG. 15F illustrates a goggle type display (a head mounted display) which includes a main body 2501, a display portion 2502, and an arm portion 2503. The light emitting device of the invention can be applied to the display portion 2502 to complete the goggle type display.

Figure 15G:
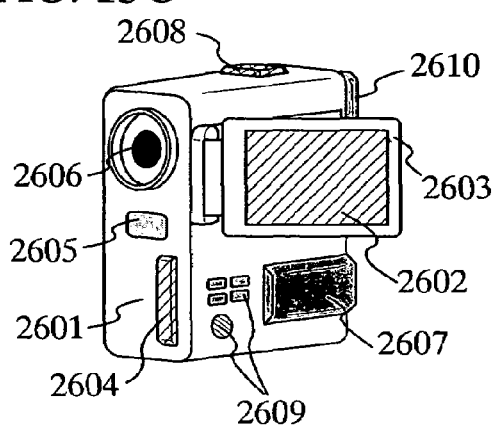

FIG. 15G illustrates a video camera which includes a main body 2601, a display portion 2602, a housing 2603, an external connecting port 2604, a remote control receiving portion 2605, an image receiving portion 2606, a battery 2607, an audio input portion 2608, operating keys 2609, an eyepiece portion 2610 and the like. The light emitting device of the invention can be applied to the display portion 2602 to complete the video camera.

Figure 15H:
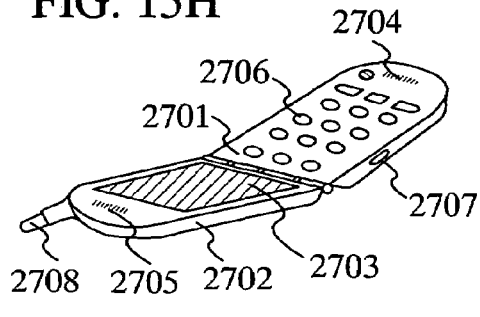
Figure 16:
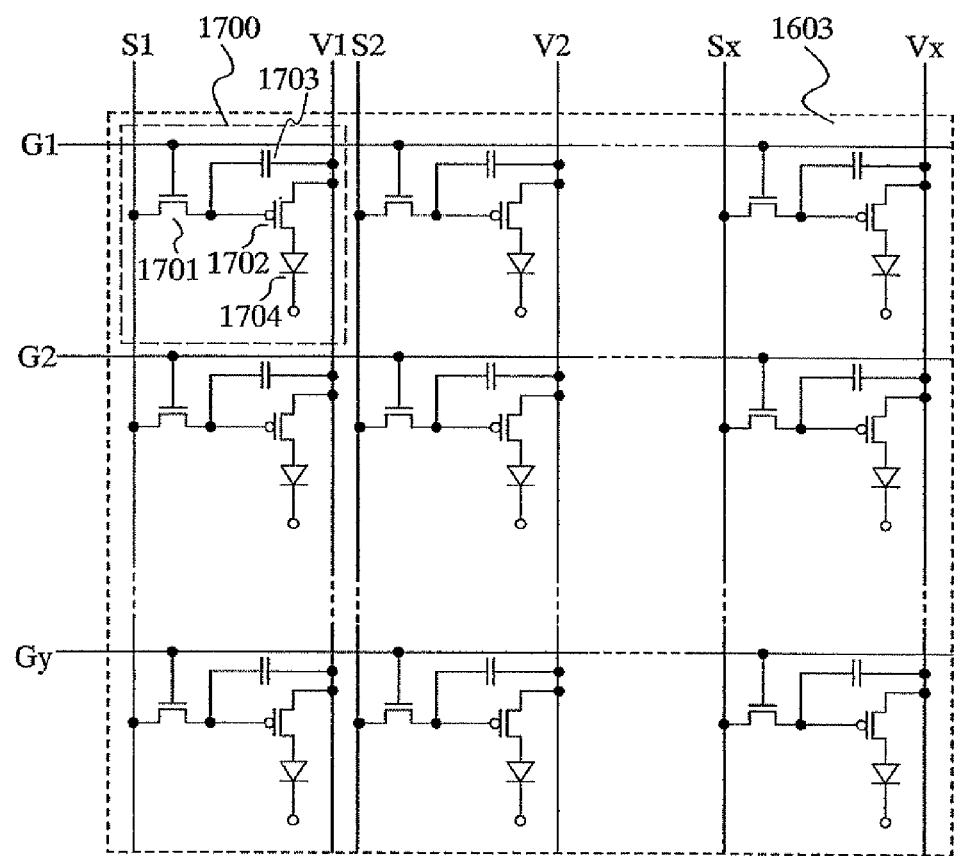
FIG. 16 is a diagram of a configuration of a pixel portion of a conventional display.
Figure 17:
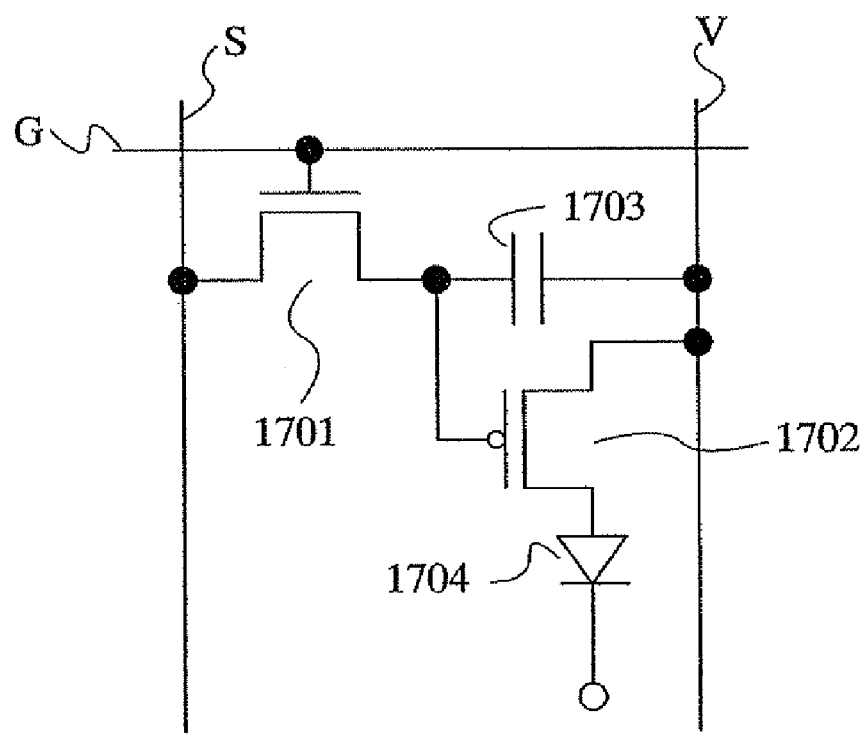
FIG. 17 is a circuit diagram of a pixel of a conventional display.

FIG. 15H illustrates a mobile phone which includes a main body 2701, a housing 2702, a display portion 2703, an audio input portion 2704, an audio output portion 2705, operating keys 2706, an external connecting port 2707, an antenna 2708 and the like. The light emitting device of the invention can be applied to the display portion 2703 to complete the mobile phone. By displaying white character on a black background in the display portion 2703, power consumption of the mobile phone can be reduced.

Note that if the light emitting intensity of the organic materials increases in the future, the light including the outputted image data can be enlarged and projected with a lens or the like, whereby it is possible to use the projected light in front type projectors or rear type projectors.

The aforementioned electronic apparatuses now increasingly display data distributed through electronic communication lines such as the Internet and CATV (cable television), particularly animated data. Since organic materials have very high response speed, light emitting devices are preferably used for animated display.

In a light emitting device, areas that emit light consume power and therefore data is preferably displayed in such a manner as to reduce areas that emit light as much as possible. It is therefore preferable to operate the light emitting device so that areas that do not emit light are used for the background and areas that emit light are used for text data when the light emitting device is used in a display portion of portable data terminals, particularly mobile phones and audio reproducing devices in which mainly text data is displayed.

Note that the present embodiment can be implemented in free combination with Embodiments 1 to 4.

This application is based on Japanese Patent Application serial no. 2003-421599 filed in Japan Patent Office on 18 Dec. 2003, the contents of which are hereby incorporated by reference.

What is claimed is:

1. A display device having a plurality of pixels, each of the plurality of pixels comprising:
   a light emitting element;
   a driving transistor for controlling the amount of forward current flowing into the light emitting element;
   a switching transistor for controlling input of a video signal; and
   an AC transistor for controlling reverse current flowing into the light emitting element,
   wherein the driving transistor and the AC transistor have the identical polarity.

2. The display device according to claim 1,
   wherein when forward voltage is applied to the light emitting element, the forward current flows between a source electrode and a drain electrode of the driving transistor; and
   wherein when reverse voltage is applied to the light emitting element, the reverse current flows between a source electrode and a drain electrode of the AC transistor.

3. The display device according to claim 1,
   wherein the ratio of a channel length of the driving transistor to a channel width thereof is 5 or more to 1.

4. The display device according to claim 1,
   wherein a channel length of the AC transistor is equal to or less than a channel width thereof.

5. An electronic apparatus employing the display device according to claim 1.

6. An electronic apparatus according to claim 5, wherein the electronic apparatus is one selected from the group consisting of a camera, a head mounted display, a navigation system, an audio reproducing device, a personal computer, a game player, a portable data terminal, and an image reproducing device.

7. A display device having a plurality of pixels, each of the plurality of pixels comprising:
   a light emitting element;
   a driving transistor for controlling the amount of forward current flowing into the light emitting element;
   a switching transistor for controlling input of a video signal; and
   an AC transistor for controlling reverse current flowing into the light emitting element,
   wherein the light emitting element comprises a pixel electrode and an opposing electrode;
   wherein a gate electrode of the switching transistor is connected to a gate signal line;
   wherein one of a source electrode and a drain electrode of the switching transistor is connected to a source signal line flowing the video signal while the other is connected to a gate electrode of the driving transistor;
   wherein one of a source electrode and a drain electrode of the driving transistor is connected to a power source line while the other is connected to the pixel electrode of the light emitting element;
   wherein a gate electrode of the AC transistor is connected to the power source line;
   wherein one of a source electrode and a drain electrode of the AC transistor is connected to the pixel electrode while the other is connected to the power source line;
   wherein the driving transistor and the AC transistor have the identical polarity;
   wherein the driving transistor operates in the saturation region; and
   wherein the AC transistor operates in the linear region.

8. The display device according to claim 7,
   wherein when forward voltage is applied to the light emitting element, the forward current flows between the source electrode and the drain electrode of the driving transistor; and
   wherein when reverse voltage is applied to the light emitting element, the reverse current flows between the source electrode and the drain electrode of the AC transistor.

9. The display device according to claim 7,
   wherein potential of the power source line is fixed and potential of the opposing potential is varied depending on a direction of current flowing into the light emitting element.

10. The display device according to claim 7,
    wherein the ratio of a channel length of the driving transistor to a channel width thereof is 5 or more to 1.

11. The display device according to claim 7,
    wherein a channel length of the AC transistor is equal to or less than a channel width thereof.

12. An electronic apparatus employing the display device according to claim 7.

13. An electronic apparatus according to claim 12, wherein the electronic apparatus is one selected from the group consisting of a camera, a head mounted display, a navigation system, an audio reproducing device, a personal computer, a game player, a portable data terminal, and an image reproducing device.

14. A display device having a plurality of pixels, each of the plurality of pixels comprising:
    a light emitting element;
    a driving transistor;
    a switching transistor; and
    an AC transistor,
    wherein the light emitting element comprises a pixel electrode and an opposing electrode;
    wherein a gate electrode of the switching transistor is connected to a gate signal line;
    wherein one of a source electrode and a drain electrode of the switching transistor is connected to a source signal line flowing the video signal while the other is connected to a gate electrode of the driving transistor;
    wherein one of a source electrode and a drain electrode of the driving transistor is connected to a power source line while the other is connected to the pixel electrode of the light emitting element;
    wherein a gate electrode of the AC transistor is connected to the power source line;
    wherein one of a source electrode and a drain electrode of the AC transistor is connected to the pixel electrode while the other is connected to the power source line; and
    wherein the driving transistor and the AC transistor have the identical polarity.

15. The display device according to claim 14,
    wherein when forward voltage is applied to the light emitting element, the forward current flows between a source electrode and a drain electrode of the driving transistor; and
    wherein when reverse voltage is applied to the light emitting element, the reverse current flows between a source electrode and a drain electrode of the AC transistor.

16. The display device according to claim 14, wherein the ratio of a channel length of the driving transistor to a channel width thereof is 5 or more to 1.

17. The display device according to claim 14, wherein a channel length of the AC transistor is equal to or less than a channel width thereof 18. An electronic apparatus employing the display device according to claim 14.

19. A display device having a plurality of pixels, each of the plurality of pixels comprising:
    a light emitting element;
    a driving transistor for controlling the amount of forward current flowing into the light emitting element;
    a switching transistor for controlling input of a video signal; and
    an AC transistor for controlling reverse current flowing into the light emitting element
    wherein the light emitting element comprises a pixel electrode and an opposing electrode;
    wherein a gate electrode of the switching transistor is connected to a gate signal line;
    wherein one of a source electrode and a drain electrode of the switching transistor is connected to a source signal line flowing the video signal while the other is connected to a gate electrode of the driving transistor;
    wherein one of a source electrode and a drain electrode of the driving transistor is connected to a power source line while the other is connected to the pixel electrode of the light emitting element;
    wherein a gate electrode of the AC transistor is connected to the power source line;
    wherein one of a source electrode and a drain electrode of the AC transistor is connected to the pixel electrode while the other is connected to the power source line; and
    wherein the driving transistor and the AC transistor have the identical polarity.

20. The display device according to claim 19,
    wherein when forward voltage is applied to the light emitting element, the forward current flows between the source electrode and the drain electrode of the driving transistor; and
    wherein when reverse voltage is applied to the tight emitting element, the reverse current flows between the source electrode and the drain electrode of the AC transistor.

21. The display device according to claim 19, wherein potential of the power source line is fixed and potential of the opposing potential is varied depending on a direction of current flowing into the light emitting element.

22. The display device according to claim 19, wherein the ratio of a channel length of the driving transistor to a channel width thereof is 5 or more to 1.

23. The display device according to claim 19, wherein a channel length of the AC transistor is equal to or less than a channel width thereof 24. An electronic apparatus employing the display device according to claim 19.

* * * * *